(12) United States Patent  (10) Patent No.: US 9,085,685 B2
Morita et al.  (45) Date of Patent: Jul. 21, 2015

(54) UNDER-FILL MATERIAL AND METHOD FOR PRODUCING SEMICONDUCTOR DEVICE

(71) Applicant: NITTO DENKO CORPORATION, Ibaraki-shi, Osaka (JP)

(72) Inventors: Kosuke Morita, Ibaraki (JP); Naohide Takamoto, Ibaraki (JP); Hiroyuki Senzai, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 13/686,841

(22) Filed: Nov. 27, 2012

(65) Prior Publication Data

US 2013/0137218 A1  May 30, 2013

(30) Foreign Application Priority Data

Nov. 28, 2011 (JP) ................. 2011-259122
Mar. 6, 2012 (JP) ................. 2012-049333
May 25, 2012 (JP) ................. 2012-119767

(51) Int. Cl.
*H01L 21/18* (2006.01)
*C08L 33/00* (2006.01)
(Continued)

(52) U.S. Cl.
CPC ............... *C08L 33/00* (2013.01); *C08L 33/10* (2013.01); *C09D 133/10* (2013.01); *H01L 21/563* (2013.01); *H01L 21/78* (2013.01); *H01L 23/18* (2013.01); *H01L 23/3737* (2013.01); *C08L 2203/206* (2013.01); *H01L 23/293* (2013.01); *H01L 2224/14181* (2013.01); *H01L 2224/16225* (2013.01); *H01L 2224/2929* (2013.01); *H01L 2224/29386* (2013.01); *H01L 2224/32225* (2013.01); *H01L 2224/73104* (2013.01);
(Continued)

(58) Field of Classification Search
CPC .............................. H01L 23/18; H01L 23/22
See application file for complete search history.

(56) References Cited

U.S. PATENT DOCUMENTS 5,001,542 A  3/1991  Tsukagoshi et al.
5,120,665 A  6/1992  Tsukagoshi et al.
(Continued)

FOREIGN PATENT DOCUMENTS

JP  2833111 B2  10/1998
JP  3868179 B2  10/2006
(Continued)

OTHER PUBLICATIONS

Japanese Patent Office, Office Action Issued in Japanese Patent Application No. 2011-259122, Apr. 14, 2015, 6 pages.

*Primary Examiner* — Cheung Lee
(74) *Attorney, Agent, or Firm* — Alleman Hall McCoy Russell & Tuttle LLP

(57) ABSTRACT

The present invention provides an under-fill material with which a semiconductor device having a high connection reliability can be provided while securing a usable material by reducing a difference in thermal-responsive behavior between a semiconductor element and an adherend, and a method for producing a semiconductor device using the under-fill material. In the under-fill material of the present invention, a storage elastic modulus E' [MPa] and a thermal expansion coefficient α [ppm/K] after carrying out a heat-curing treatment at 175° C. for an hour satisfy the following formula (1) at 25° C.:

$$E' \times \alpha < 250000 \ [Pa/K] \quad (1).$$

8 Claims, 10 Drawing Sheets

(51) Int. Cl.
*H01L 23/18* (2006.01)
*H01L 21/78* (2006.01)
*C09D 133/10* (2006.01)
*C08L 33/10* (2006.01)
*H01L 23/373* (2006.01)
*H01L 21/56* (2006.01)
*H01L 23/29* (2006.01)

(52) U.S. Cl.
CPC .............. *H01L2224/73204* (2013.01); *H01L 2224/81193* (2013.01); *H01L 2224/83191* (2013.01)

(56) References Cited

U.S. PATENT DOCUMENTS

| | | |
|---|---|---|
| 5,128,746 A | 7/1992 | Pennisi et al. |
| 5,843,251 A | 12/1998 | Tsukagoshi et al. |
| 6,113,728 A | 9/2000 | Tsukagoshi et al. |
| 6,562,482 B1 | 5/2003 | Sakamoto |
| 2002/0001688 A1 | 1/2002 | Ueda et al. |
| 2003/0207117 A1 | 11/2003 | Ueda et al. |
| 2004/0101688 A1 | 5/2004 | Rubinsztajn et al. |
| 2004/0102529 A1 | 5/2004 | Campbell et al. |
| 2004/0138343 A1 | 7/2004 | Campbell et al. |
| 2005/0048291 A1 | 3/2005 | Woo et al. |
| 2005/0048700 A1 | 3/2005 | Rubinsztajn et al. |
| 2005/0049334 A1 | 3/2005 | Rubinsztain et al. |
| 2005/0049352 A1 | 3/2005 | Rubinsztajn et al. |
| 2005/0054776 A1* | 3/2005 | Itou et al. ............ 525/191 |
| 2005/0131106 A1 | 6/2005 | Tonapi et al. |
| 2005/0170188 A1 | 8/2005 | Campbell et al. |
| 2005/0181214 A1 | 8/2005 | Campbell et al. |
| 2005/0266263 A1 | 12/2005 | Campbell et al. |
| 2006/0147719 A1 | 7/2006 | Rubinsztajn et al. |
| 2010/0101845 A1* | 4/2010 | Kishi et al. ............ 174/259 |
| 2011/0006419 A1 | 1/2011 | Hirano |
| 2011/0241228 A1 | 10/2011 | Enomoto et al. |
| 2012/0214010 A1 | 8/2012 | Kagimoto et al. |

FOREIGN PATENT DOCUMENTS

| | | |
|---|---|---|
| JP | 2007515524 A | 6/2007 |
| JP | 2009212511 A | 9/2009 |
| JP | 4438973 B2 | 1/2010 |
| JP | 2010265359 A | 11/2010 |
| JP | 2011151251 A | 8/2011 |
| JP | 2011190395 A | 9/2011 |
| WO | 2011052615 A1 | 5/2011 |

* cited by examiner

UNDER-FILL MATERIAL AND METHOD FOR PRODUCING SEMICONDUCTOR DEVICE

BACKGROUND OF THE INVENTION

1. Field of the Invention

The present invention relates to an under-fill material and a method for producing a semiconductor device.

2. Description of the Related Art

As a first background, in recent years, demands for high-density mounting have been increased as electronic instruments have become smaller and thinner. Accordingly, for semiconductor packages, the surface mount type has become mainstream suitable for high-density mounting in place of the conventional pin insertion type. In the surface mount type, a lead is soldered directly to a printed board or the like. For a heating method, the whole of a package is heated by infrared reflow, vapor phase reflow, solder dip or the like to perform mounting.

After surface mounting, a sealing resin is filled in a space between a semiconductor element and a substrate for ensuring protection of the surface of the semiconductor element and connection reliability between the semiconductor element and the substrate. As this sealing resin, a liquid sealing resin is widely used, but it is difficult to adjust an injection position and an injection amount with the liquid sealing resin. Thus, there has been proposed a technique of filling a space between a semiconductor element and a substrate using a sheet-like sealing resin (JP-B1-4438973 and JP-B1-2833111).

Generally, for a process using a sheet-like sealing resin, such a procedure is employed that a sheet-like sealing resin is attached to a semiconductor wafer, the semiconductor wafer is then diced to form a semiconductor element, and a space between an adherend such as a substrate and the semiconductor element is filled with the sheet-like sealing resin integrated with the semiconductor element while connecting the semiconductor element to the adherend to perform mounting. In this process, a space between an adherend and a semiconductor element is easily filled.

As a second background, in mounting of a semiconductor element on an adherend, an electrode such as a solder bump provided on a semiconductor element is melted to electrically connect the semiconductor device and the adherend. At this time, for the purpose of removing an oxide film on the surface of the electrode, improving wettability of the solder, and so on, a flux agent derived from carboxylic acid or the like is added to a liquid sealing resin in some cases (JP-B1-3868179). Recently, there has been proposed a technique of adding a flux agent of carboxylic acid also to the sheet-like sealing resin as described above (U.S. Pat. No. 5,128,746).

As a third background, in the process described above, a space between an adherend and a semiconductor element is easily filled. On the other hand, as the circuit width and the distance between terminals in the semiconductor element are reduced, occurrence of even a slight displacement at the time of matching to a connection position during mounting may lead to damages of the semiconductor element, failures of joining during mounting, and so on, and hence to a reduction in yield ratio in production of a semiconductor device.

Concerning positioning during mounting, since a sheet-like under-fill material is previously laminated on the semiconductor element, the under-fill material is required to have such a level of permeability that a mark for alignment, which is given to the semiconductor element, can be recognized at the time of alignment of the semiconductor element and a substrate during mounting of the semiconductor element. However, since the under-fill material generally contains an additive such as a silica filler for improving its properties, the permeability of the under-fill material may decrease, so that it becomes difficult to align the semiconductor element and the substrate during mounting of the semiconductor element.

As an under-fill composition for solving the above-mentioned problems, there has been proposed a technique of improving the transparency of the under-fill material by combining a first curable transparent resin composition, which contains a colloidal silica dispersion and an epoxy resin, and a second curable flux composition which contains a curable flux composition (JP-W-2007-515524)).

SUMMARY OF THE INVENTION

In relation to the first background, the semiconductor device may be made smaller and thinner by reducing the thickness of the semiconductor element, but influences of the thermal-responsive behavior of the adherend (warp and expansion, etc.) on the semiconductor element increase as the semiconductor element becomes thinner. This results from the fact that the thermal expansion coefficient of an adherend such as a substrate is generally higher than that of a semiconductor element. Particularly, stress resulting from a difference in thermal-responsive behavior between the semiconductor element and the adherend tends to localize on a connection member such as a solder bump for connecting the semiconductor element and the adherend, and the joint may be broken in some cases. As a measure against this, the materials and the like of the semiconductor element and the adherend can be selected so as to match the thermal-responsive behaviors of the former and the latter, but a range of materials that can be selected is limited.

An object of the present invention is to provide an under-fill material with which a semiconductor device having a high connection reliability can be provided while securing a usable material by reducing a difference in thermal-responsive behavior between a semiconductor element and an adherend, and a method for producing a semiconductor device using the under-fill material.

In relation to the second background, required properties of a sheet-like sealing resin, to which a carboxylic acid-based flux agent is added, include, in addition to a flexibility necessary for ease of handling as a sheet-like sealing composition, the flux agent being capable of sufficiently exhibiting a flux function during mounting of a semiconductor element. Namely, the carboxylic acid-based flux agent has a high reactivity with an epoxy resin added as a thermosetting resin, and therefore the carboxylic acid-based flux agent and the epoxy resin may react with each other over time just after the preparation of the sheet-like sealing composition, so that the flexibility of the sheet-like sealing composition is decreased. Heat during mounting may cause the flux agent to react with the epoxy resin before performing a flux function, so that a flux function for a solder joint cannot be sufficiently exhibited.

In U.S. Pat. No. 5,128,746, a space between the semiconductor element and the substrate can be easily filled, but there is a room for improvement in terms of over time stability of flexibility, and the flux agent cannot perform a flux function at the time of mounting in some cases.

Thus, an object of the present invention is to provide a sheet-like sealing composition, having a over time-stable flexibility and being capable of sufficiently exhibiting a flux function by a carboxylic acid, and a method for producing a semiconductor element using the sheet-like sealing composition.

Further, in relation to the third background, although the transparency of the under-fill material is improved in the above-mentioned technique, it is necessary for this purpose to use specific components such as a functionalized colloidal silica dispersion that is a nano-sized filler having a predetermined functional group, a cyclic aliphatic epoxy monomer and the like, and therefore, materials that can be used for the under-fill material are limited.

Thus, an object of the present invention is to provide a method for producing a semiconductor device in which there is no particular limitation on a material for forming an under-fill material, and alignment for mounting of a semiconductor element is easy.

As a result of conducting vigorous studies on the problem related to the first background, the present inventors have found that the aforementioned object can be achieved by employing the following configuration, thus leading to completion of the present invention.

That is, in an under-fill material of the present invention, a storage elastic modulus E' [MPa] and a thermal expansion coefficient α [ppm/K] after carrying out a heat-curing treatment at 175° C. for an hour satisfy the following formula (1) at 25° C.

$$E' \times \alpha < 250000 \text{ [Pa/K]} \tag{1}$$

Since the storage elastic modulus E' [MPa] and the thermal expansion coefficient α [ppm/K] of the under-fill material after heat curing satisfy the formula (1), a difference in thermal-responsive behavior between a semiconductor element and an adherend can be reduced, so that a semiconductor device, whose joint is inhibited from being broken and thereby having a high connection reliability, can be obtained. In the formula (1), the storage elastic modulus E' and the thermal expansion coefficient α are inversely proportional to each other. As the storage elastic modulus E' increases, the stiffness of the under-fill material itself is improved, so that stress can be absorbed or scattered. At this time, the thermal expansion coefficient α decreases, and the thermal expansion behavior of the under-fill material itself is suppressed, so that mechanical damages to adjacent members (i.e. semiconductor element and adherend) can be reduced. On the other hand, as the storage elastic modulus E' decreases, the plasticity of the under-fill material itself is improved, so that the thermal-responsive behavior of the adjacent members, especially the adherend can be absorbed. At this time, the thermal expansion coefficient α increases, and the thermal-responsive behavior of the under-fill material conforms to the thermal-responsive behavior of the adherend, while influences on the semiconductor element is suppressed due to a decrease in the storage elastic modulus E', so that stress as a whole is relaxed. As seen from the above, since optimum relaxation of mutual stress of the semiconductor element, the adherend and the under-fill material can be achieved, breakage of a connection member can also be suppressed, and resultantly the connection reliability of the semiconductor device can be improved. Methods for measuring the storage elastic modulus E' and the thermal expansion coefficient α are as described in Examples.

In the under-fill material, it is preferable that the storage elastic modulus E' be 100 to 10000 [MPa] and the thermal expansion coefficient α be 10 to 200 [ppm/K]. Stress on the whole system can be efficiently relaxed as the storage elastic modulus E' and the thermal expansion coefficient α respectively fall in such range.

In the under-fill material, the storage elastic modulus E' [MPa] and the thermal expansion coefficient α [ppm/K] preferably satisfy the following formula (2).

$$10000 < E' \times \alpha < 250000 \text{ [Pa/K]} \tag{2}$$

Optimum relaxation of mutual stress of the semiconductor element, the adherend and the under-fill material can be more easily achieved as the storage elastic modulus E' and the thermal expansion coefficient α satisfy the formula (2).

The under-fill material preferably contains a thermoplastic resin and a thermosetting resin. In one embodiment, the thermoplastic resin preferably contains an acrylic resin. In another embodiment, the thermosetting resin preferably contains an epoxy resin and a phenol resin. By employing these resins as constituent materials, satisfaction of the formula (1) by the under-fill material can be easily achieved.

The present invention also includes a sealing sheet having a back surface grinding tape, and the under-fill material laminated on the back surface grinding tape. By using the under-fill material and the back surface grinding tape in an integral form, the efficiency of a production process of from grinding of the back surface of a semiconductor wafer up to mounting of a semiconductor element can be improved.

The present invention also includes a method for producing a semiconductor device including an adherend, a semiconductor element electrically connected to the adherend, and an under-fill material that fills a space between the adherend and the semiconductor element, wherein the method includes:

a bonding step of bonding together a circuit surface of a semiconductor wafer, on which a connection member is formed, and an under-fill material of the sealing sheet;

a grinding step of grinding a surface opposite to the circuit surface of the semiconductor wafer;

a dicing step of dicing the semiconductor wafer to form a semiconductor element with the under-fill material; and a connection step of electrically connecting the semiconductor element and the adherend through the connection member while filling a space between the adherend and the semiconductor element using the under-fill material.

By the production method, there can be efficiently produced a semiconductor device having a high connection reliability, in which a difference in thermal-responsive behavior between a semiconductor element and an adherend is reduced while smoothing a flow of from grinding of the back surface of a semiconductor wafer up to mounting of the semiconductor element.

As a result of conducting vigorous studies on the problem related to the second background, the present inventors have found that the aforementioned object can be achieved by employing a specific resin composition and a carboxylic acid, thus leading to completion of the present invention.

That is, a sheet-like sealing composition of the present invention includes:

a thermoplastic resin having a weight average molecular weight of 100000 or more;

an epoxy resin;

a curing accelerator; and a carboxyl group-containing compound having a pKa of 3.5 or more.

Since the sheet-like sealing composition (hereinafter, referred to simply as "sealing composition" in some cases) uses as a flux agent a carboxyl group-containing compound having a pKa of 3.5 or more (hereinafter, referred to simply as "carboxyl group-containing compound" in some cases), generation of carboxylic acid ions can be suppressed, and whereby reactivity with an epoxy resin can also be suppressed. As a result, the carboxyl group-containing compound is not caused to immediately react with an epoxy resin by heat during mounting of a semiconductor, and thereafter can sufficiently exhibit a flux function by means of heat given over time. Since in addition to employment of the specific carboxyl group-containing compound, not only an epoxy resin but also a thermoplastic resin having a weight average molecular weight of 100000 or more is contained, a moderate plasticity can be performed over time, and an over time-stable flexibility can be exhibited.

In the sealing resin composition, the carboxyl group-containing compound is preferably at least one selected from the group consisting of:

an aromatic carboxylic acid having in each molecule at least one substituent selected from the group consisting of an alkyl group, an alkoxy group, an aryloxy group, an aryl group and an alkylamino group, and an aliphatic carboxylic acid having in each molecule one or more carboxyl group and having a carbon number of 8 or more.

By selecting the carboxyl group-containing compound from aromatic carboxylic acids having a specific substituent in each molecule and aliphatic carboxylic acids as described above, reactivity with an epoxy resin is suppressed, and whereby an over time-stability of flexibility and performance of a flux function can be efficiently achieved.

In the sealing composition, the aromatic carboxylic acid is preferably a benzoic acid derivative in which at least one of hydrogen atoms at 2-, 4- and 6-positions are independently substituted with an alkyl group, an alkoxy group, an aryloxy group, an aryl group or an alkylamino group. As the substituent of the benzoic acid derivative is present at a specific position, reactivity with an epoxy resin can be further suppressed, thus contributing to over time-stability of flexibility and performance of a flux function.

Further, the benzoic acid derivative is preferably a benzoic acid derivative in which a hydrogen atom at the 2- or 4-position is substituted with a methoxy group, a phenoxy group, a phenyl group or a dimethylamino group. Such a benzoic acid derivative is easily available, and also suppression of reactivity with an epoxy resin, and associated over time-stability of flexibility and performance of a flux function can be more efficiently achieved.

In the sealing composition, the benzoic acid derivative preferably contains no hydroxyl group. By eliminating the hydroxyl group which can be a point of reaction with an epoxy resin, the sealing composition can suitably exhibit a flux function while maintaining flexibility.

In the sealing composition, the aliphatic carboxylic acid is preferably a chain aliphatic dicarboxylic acid having a carbon number of 8 to 12 or a cycloaliphatic dicarboxylic acid. Such a specific aliphatic carboxylic acid has a bulky structure, and therefore reactivity with an epoxy resin can be suppressed by steric hindrance. At the same time, a flux function can be sufficiently exhibited by taking a form of a dicarboxylic acid.

The sealing composition preferably further contains a phenol-based curing agent. Consequently, a crosslinked structure with an epoxy resin can be constructed, and thermal stability of the sealing resin composition after curing can be improved.

In the sealing composition, the thermoplastic resin is preferably an acrylic resin. Consequently, the tackiness and strength of the sealing composition especially after curing can be improved, so that the connection reliability can be improved.

The present invention also includes a method for producing a semiconductor device, wherein the method includes:

a bonding step of bonding together a surface of a semiconductor wafer, on which a connection member is formed, and the sheet-like sealing composition;

a dicing step of dicing the semiconductor wafer to form a semiconductor element with the sheet-like sealing composition; and a connection step of electrically connecting the semiconductor element and the adherend through the connection member while filling a space between the adherend and the semiconductor element using the sheet-like sealing composition.

As a result of conducting vigorous studies on the problem related to the third background, the present inventors have found that the aforementioned object can be achieved by employing the following configuration, thus leading to completion of the present invention.

That is, the present invention is a method for producing a semiconductor device including an adherend, a semiconductor element electrically connected to the adherend, and an under-fill material that fills a space between the adherend and the semiconductor element, wherein the method includes:

a position matching step of irradiating oblique light to an exposed surface of an under-fill material bonded to a circuit surface of a semiconductor element and having a total light transmittance of 50% or more, and matching a relative position of the semiconductor element and the adherend to a predetermined position for connection of each other; and a connection step of electrically connecting the semiconductor element and the adherend through the connection member while filling a space between the adherend and the semiconductor element using the under-fill material.

In the production method, even if the total light transmittance of the under-fill material decreases to about 50%, the position of the semiconductor element can be accurately detected merely by irradiating oblique light to the exposed surface of the under-fill material. Consequently, position matching to the predetermined position for connection of the semiconductor element and the adherend can be easily performed and as a result, a semiconductor device can be efficiently produced without necessity to give special consideration to a material for forming the under-fill material. A method for measuring the total light transmittance is as described in Examples.

In the production method, the oblique light is preferably irradiated to the exposed surface of the under-fill material at an incident angle of 5 to 85°. By irradiating oblique light at this incident angle, regular reflection light can be prevented to improve position detection accuracy of the semiconductor element, so that accuracy of matching to the predetermined position for connection can be further improved.

In the production method, the oblique light preferably has a wavelength of 400 to 550 nm. When oblique light has the above-mentioned specific wavelength, a good permeability is shown even for an under-fill material formed of a general material including an inorganic filler, and therefore matching to the predetermined position for connection of the semiconductor element and the adherend can be more easily performed.

In the production method, the oblique light is preferably irradiated to the exposed surface of the under-fill material in two or more directions or in all directions. By irradiation of oblique light in multiple directions or all directions (all-round direction), diffused reflection from the semiconductor element can be increased to improve accuracy of position detection, so that accuracy of matching to the predetermined position for connection to the adherend can be further improved.

In the production method, even if the under-fill material contains a general inorganic filler, position detection of the semiconductor element and matching to the predetermined position for connection can be easily performed by the oblique light irradiation.

In the production method, the average particle diameter of the inorganic filler is preferably 0.005 to 10 μm. If the average particle diameter of the inorganic filler is less than 0.005 μm, it becomes a cause of decreasing the flexibility of the under-fill material. On the other hand, if the average particle diameter is more than 10 μm, it becomes a factor of decreasing a sealing property as the particle diameter is large with respect to a gap to be sealed by the under-fill material.

In the production method, the under-fill material preferably contains a thermoplastic resin and a thermosetting resin. Consequently, a plasticity, a strength and a tackiness required for improving the adhesion of the under-fill material to the semiconductor wafer in the bonding step can be imparted to the under-fill material with good balance while maintaining the transparency of the under-fill material.

DETAILED DESCRIPTION OF THE PREFERRED EMBODIMENTS

First Embodiment

In an under-fill material of this embodiment, a storage elastic modulus E' [MPa] and a thermal expansion coefficient α [ppm/K] after heat curing treatment satisfy a predetermined relationship. Hereinafter, one embodiment of the present invention will be described below taking as an example a sealing sheet having an under-fill material integrated with back surface grinding tape and a method for producing a semiconductor device using the sealing sheet. Descriptions below can also be applied to the case of an under-fill material alone in principle.

(Sealing Sheet)

Figure 1:
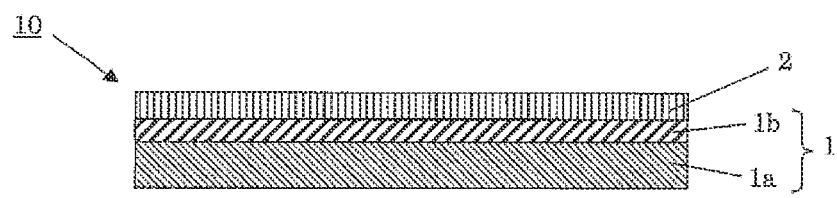
FIG. 1 is a sectional schematic view showing a sealing sheet having an under-fill material according to one embodiment of the present invention.

As shown in FIG. 1, a sealing sheet 10 has a back surface grinding tape 1 and an under-fill material 2 laminated on the back surface grinding tape 1. The under-fill material 2 is not necessarily laminated on the entire surface of the back surface grinding tape 1 as shown in FIG. 1, but may be provided in a size sufficient for bonding with a semiconductor wafer 3 (see FIG. 2A).

(Back Surface Grinding Tape)

The back surface grinding tape 1 includes a base material 1a, and a pressure-sensitive adhesive layer 1b laminated on the base material 1a. The under-fill material 2 is laminated on the pressure-sensitive adhesive layer 1b.

(Base Material)

The base material 1a is a reinforcement matrix for the sealing sheet 10. Examples include polyolefins such as low-density polyethylene, linear polyethylene, medium-density polyethylene, high-density polyethylene, very low-density polyethylene, random copolymerized polypropylene, block copolymerized polypropylene, homo polypropylene, polybutene and polymethylpentene, an ethylene-vinyl acetate copolymer, an ionomer resin, an ethylene-(meth)acrylic acid copolymer, an ethylene-(meth)acrylate (random, alternating) copolymer, an ethylene-butene copolymer, an ethylene-hexene copolymer, polyurethane, polyesters such as polyethylene terephthalate and polyethylene naphthalate, polycarbonate, polyimide, polyether ether ketone, polyimide, polyetherimide, polyamide, total aromatic polyamide, polyphenyl sulfide, alamid (paper), glass, glass cloth, a fluororesin, polyvinyl chloride, polyvinylidene chloride, a cellulose-based resin, a silicone resin, a metal (foil), and papers such as glassine paper. When the pressure-sensitive adhesive layer 1b is of an ultraviolet-ray curing type, the base material 1a is preferably one having a permeability to ultraviolet rays.

In addition, examples of the material of the base material 1a include polymers such as crosslinked products of the resins described above. For the plastic film described above, an unstretched film may be used, or a film subjected to uniaxial or biaxial stretching may be used as necessary.

The surface of the base material 1a can be subjected to a common surface treatment, for example, a chemical or physical treatment such as a chromic acid treatment, ozone exposure, flame exposure, high-voltage electrical shock exposure or an ionized radiation treatment, or a coating treatment with a primer (e.g. adhesive substance to be described) for improving adhesion with an adjacent layer, the retention property and so on.

For the base material 1a, the same material or different materials can be appropriately selected and used, and one obtained by blending several materials can be used as necessary. The base material 1a can be provided thereon with a vapor-deposited layer of an electrically conductive substance made of a metal, an alloy, an oxide thereof, or the like and having a thickness of about 30 to 500 Å for imparting an antistatic property. The base material 1a may be a single layer or a multiple layer having two or more layers.

The thickness of the base material 1a is not particularly limited, and can be appropriately determined, but is generally about 5 to 200 µm, and is preferably 35 to 120 µm.

The base material 1a may contain various kinds of additives (e.g. colorant, filler, plasticizer, antiaging agent, antioxidant, surfactant, flame retardant, etc.) within the bounds of not impairing the effect of the present invention.

(Pressure-Sensitive Adhesive Layer)

A pressure-sensitive adhesive used for forming the pressure-sensitive adhesive layer 1b is not particularly limited as long as it can tightly hold a semiconductor wafer or a semiconductor chip through an under-fill material at the time of dicing, and provide control so that the semiconductor chip with the under-fill material can be peeled off during pickup. For example, a general pressure-sensitive adhesive such as an acryl-based pressure-sensitive adhesive or a rubber-based pressure-sensitive adhesive can be used. As the pressure-sensitive adhesive, an acryl-based pressure-sensitive adhesive having an acryl-based polymer as a base polymer is preferable from the viewpoint of ease of cleaning of an electronic component sensitive to contamination, such as a semiconductor wafer or glass, using ultrapure water or an organic solvent such as an alcohol.

Examples of the acryl-based polymer include those using an acrylate as a main monomer component. Examples of the acrylate include one or more of (meth)acrylic acid alkyl esters (for example, linear or branched alkyl esters with the alkyl group having 1 to 30, particularly 4 to 18 carbon atoms, such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nony ester, decyl ester, isodecyl ester, undecyl ester, dodecyl ester, tridecyl ester, tetradecyl ester, hexadecyl ester, octadecyl ester and eicosyl ester) and (meth)acrylic acid cycloalkyl esters (for example, cyclopentyl ester and cyclohexyl ester, etc.). The (meth)acrylic acid ester refers to an acrylic acid ester and/or a methacrylic acid ester, and (meth) has the same meaning throughout the present invention.

The acryl-based polymer may contain a unit corresponding to any other monomer component capable of being copolymerized with the (meth)acrylic acid alkyl ester or cycloalkyl ester as necessary for the purpose of modifying cohesive strength, heat resistance and so on. Examples of the monomer component include carboxyl group-containing monomers such as acrylic acid, methacrylic acid, carboxyethyl(meth) acrylate, carboxypentyl(meth)acrylate, itaconic acid, maleic acid, fumaric acid and crotonic acid; acid anhydride monomers such as maleic anhydride and itaconic anhydride; hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate and (4-hydroxymethylcyclohexyl)-methyl(meth)acrylate; sulfonic acid group-containing monomers such as styrenesulfonic acid, allylsulfonic acid, 2-(meth)acrylamide-2-methylpropanesulfonic acid, (meth)acrylamidepropanesulfonic acid, sulfopropyl(meth)acrylate and (meth)acryloyloxynaphthalenesulfonic acid; phosphoric acid group-containing monomers such as 2-hydroxyethylacryloyl phosphate; and acrylamide and acrylonitrile. One or more of these monomers capable of being copolymerized can be used. The used amount of the monomer component capable of copolymerization is preferably 40% by weight or less based on total monomer components.

Further, the acryl-based polymer may contain a polyfunctional monomer or the like as a monomer component for copolymerization as necessary for the purpose of crosslinking. Examples of the polyfunctional monomer include hexanediol di(meth)acrylate, (poly)ethylene glycol di(meth) acrylate, (poly) propylene glycol di(meth)acrylate, neopentylglycol di(meth)acrylate, pentaerythrithol di(meth) acrylate, trimethylolpropane tri(meth)acrylate, pentaerythrithol tri(meth)acrylate, dipentaerythrithol hexa(meth)acrylate, epoxy(meth)acrylate, polyester(meth)acrylate and urethane(meth)acrylate. One or more of these polyfunctional monomers can be used. The used amount of the polyfunctional monomer is preferably 30% by weight or less based on total monomer components from the viewpoint of an adhesion property.

The acryl-based polymer is obtained by subjecting a single monomer or monomer mixture of two or more kinds of monomers to polymerization. Polymerization can be carried out by any method such as solution polymerization, emulsion polymerization, bulk polymerization or suspension polymerization. The content of low-molecular weight substances is preferably low from the viewpoint of prevention of contamination of a clean adherend. In this respect, the number average molecular weight of the acryl-based polymer is preferably 300000 or more, further preferably about 400000 to 3000000.

For the pressure-sensitive adhesive, an external crosslinker can also be appropriately employed for increasing the number average molecular weight of an acryl-based polymer or the like as a base polymer. Specific examples of the external crosslinking methods include a method in which so called a crosslinker such as a polyisocyanate compound, an epoxy compound, an aziridine compound or a melamine-based crosslinker is added and reacted. When an external crosslinker is used, the used amount thereof is appropriately determined according to a balance with a base polymer to be crosslinked, and further a use application as a pressure-sensitive adhesive. Generally, the external crosslinker is blended in an amount of preferably about 5 parts by weight or less, further preferably 0.1 to 5 parts by weight, based on 100 parts by weight of the base polymer. Further, for the pressure-sensitive adhesive, previously known various kinds of additives, such as a tackifier and an anti-aging agent, may be used as necessary in addition to the aforementioned components.

The pressure-sensitive adhesive layer 1b can be formed by radiation curing-type pressure-sensitive adhesive. By irradiating the radiation curing-type pressure-sensitive adhesive with radiations such as ultraviolet rays, the degree of crosslinking thereof can be increased to easily reduce its adhesive power, so that pickup can be easily performed. Examples of radiations include X-rays, ultraviolet rays, electron rays, α rays, β rays and neutron rays.

For the radiation curing-type pressure-sensitive adhesive, one having a radiation-curable functional group such as a carbon-carbon double bond and showing adherability can be used without particular limitation. Examples of the radiation curing-type pressure-sensitive adhesive may include, for example an addition-type radiation-curable pressure-sensitive adhesive obtained by blending a radiation-curable monomer component or an oligomer component with a general pressure-sensitive adhesive such as the above-mentioned acryl-based pressure-sensitive adhesive or rubber-based pressure-sensitive adhesive.

Examples of the radiation curable monomer component to be blended include urethane oligomer, urethane(meth)acrylate, trimethylolpropane tri(meth)acrylate, tetramethylolmethane tetra(meth)acrylate, pentaerythrithol tri(meth)acrylate, pentaerythrithol tetra(meth)acrylate, dipentaerythrithol monohydroxypenta(meth)acrylate, dipentaerythrithol hexa(meth)acrylate and 1,4-butanediol di(meth)acrylate. Examples of the radiation curable oligomer component include various oligomers such as urethane-based, polyether-based, polyester-based, polycarbonate-based and polybutadiene-based oligomers, and the appropriate weight-average molecular weight thereof is in a range of about 100 to 30000. For the blending amount of the radiation curable monomer component or oligomer component, an amount allowing the adhesive strength of the pressure-sensitive adhesive layer to be reduced can be appropriately determined according to the type of the pressure-sensitive adhesive layer. Generally, the blending amount is, for example, 5 to 500 parts by weight, preferably about 40 to 150 parts by weight, based on 100 parts by weight of a base polymer such as an acryl-based polymer forming the pressure-sensitive adhesive.

Examples of the radiation curing-type pressure-sensitive adhesive include, besides the addition-type radiation curing-type pressure-sensitive adhesive described previously, an intrinsic radiation curing-type pressure-sensitive adhesive using, as a base polymer, a polymer having a carbon-carbon double bond in the polymer side chain or main chain or at the end of the main chain. The intrinsic radiation curing-type pressure-sensitive adhesive is preferable because it is not required to contain, or mostly does not contain an oligomer component or the like which is a low-molecular component, and therefore the oligomer component or the like does not migrate in the pressure-sensitive adhesive over time, so that a pressure-sensitive adhesive layer having a stable layer structure can be formed.

For the base polymer having a carbon-carbon double bond, one having a carbon-carbon double bond and also an adherability can be used without no particular limitation. Such a base polymer is preferably one having an acryl-based polymer as a basic backbone. Examples of the basic backbone of the acryl-based polymer include the acryl-based polymers described previously as an example.

The method for introducing a carbon-carbon double bond into the acryl-based polymer is not particularly limited, and various methods can be employed, but it is easy in molecular design to introduce the carbon-carbon double bond into a polymer side chain. Mention is made to, for example, a method in which a monomer having a functional group is copolymerized into an acryl-based polymer beforehand, and thereafter a compound having a functional group that can react with the above-mentioned functional group, and a carbon-carbon double bond is subjected to a condensation or addition reaction while maintaining the radiation curability of the carbon-carbon double bond.

Examples of the combination of these functional groups include a combination of a carboxylic acid group and an epoxy group, a combination of a carboxylic acid group and an aziridyl group and a combination of a hydroxyl group and an isocyanate group. Among these combinations of functional groups, the combination of a hydroxyl group and an isocyanate group is suitable in terms of ease of reaction tracing. The functional group may be present at the side of any of the acryl-based polymer and the aforementioned compound as long as the combination of the functional groups is such a combination that the acryl-based polymer having a carbon-carbon double bond is generated, but for the preferable combination, it is preferred that the acryl-based polymer have a hydroxyl group and the aforementioned compound have an isocyanate group. In this case, examples of the isocyanate compound having a carbon-carbon double bond include metacryloyl isocyanate, 2-metacryloyloxyethyl isocyanate, m-isopropenyl-α,α-dimethylbenzyl isocyanate. As the acryl-based polymer, one obtained by copolymerizing the hydroxy group-containing monomers described previously as an example, ether-based compounds such as 2-hydroxyethyl vinyl ether, 4-hydroxybutyl vinyl ether and diethylene glycol monovinyl ether, and so on is used.

For the intrinsic radiation curing-type pressure-sensitive adhesive, the base polymer (particularly acryl-based polymer) having a carbon-carbon double bond can be used alone, but the radiation curable monomer component or oligomer component within the bounds of not deteriorating properties can also be blended. The amount of the radiation curable oligomer component or the like is normally within a range of 30 parts by weight or less, preferably in a range of 0 to 10 parts by weight, based on 100 parts by weight of the base polymer.

A photopolymerization initiator is preferably included in the radiation curing-type pressure-sensitive adhesive when it is cured by ultraviolet rays or the like. Examples of the photopolymerization initiator include α-ketol-based compounds such as 4-(2-hydroxyethoxy)phenyl(2-hydroxy-2-propyl)ketone, α-hydroxy-α,α'-dimethylacetophenone, 2-methyl-2-hydroxypropiophenone and 1-hydroxycyclohexyl phenyl ketone; acetophenone-based compounds such as methoxyacetophenone, 2,2-dimethoxy-2-phenylacetophenone, 2,2-diethoxyacetophenone, and 2-methyl-1-[4-(methylthio)-phenyl]-2-morphorinopropane-1; benzoin ether-based compounds such as benzoin ethyl ether, benzoin isopropyl ether and anisoin methyl ether; ketal-based compounds such as benzyldimethylketal; aromatic sulfonyl chloride-based compounds such as 2-naphthalenesulfonyl chloride; photoactive oxime-based compounds such as 1-phenyl-1,2-propanedione-2-(O-ethoxycarbonyl)oxime; benzophenone-based compounds such as benzophenone, benzoyl benzoic acid and 3,3'-dimethyl-4-methoxybenzophenone; thioxanthone-based compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone and 2,4-diisopropylthioxanthone; camphorquinone; halogenated ketone; acylphosphinoxide; and acylphosphonate. The blending amount of the photopolymerization initiator is, for example, about 0.05 to 20 parts by weight based on 100 parts by weight of the base polymer such as an acryl-based polymer which forms a pressure-sensitive adhesive.

When curing hindrance by oxygen occurs at the time of the irradiation of radiations, it is desirable to block oxygen (air) from the surface of the radiation curing-type pressure-sensitive adhesive layer 1b by some method. Examples include a method in which the surface of the pressure-sensitive adhesive layer 1b is covered with a separator, and a method in which irradiation of radiations such as ultraviolet rays or the like is carried out in a nitrogen gas atmosphere.

The pressure-sensitive adhesive layer 1b may contain various kinds of additives (e.g. colorant, thickener, bulking agent, filler, tackifier, plasticizer, antiaging agent, antioxidant, surfactant, crosslinker, etc.).

The thickness of the pressure-sensitive adhesive layer 1b is not particularly limited, but is preferably about 1 to 50 μm from the viewpoint of compatibility of prevention of chipping of a chip cut surface, fixation and retention of an under-fill material 2, and so on. The thickness is preferably 2 to 30 μm, more preferably 5 to 25 μm.

(Under-Fill Material)

An under-fill material 2 in this embodiment can be used as a film for sealing, which fills a space between a surface-mounted (for example, flip-chip mounted, or the like) semiconductor element and an adherend.

In the under-fill material of this embodiment, a storage elastic modulus E' [MPa] and a thermal expansion coefficient α [ppm/K] after carrying out a heat-curing treatment at 175° C. for an hour satisfy the following formula (1) at 25° C.

$$E' \times \alpha < 250000 \text{ [Pa/K]} \quad (1)$$

Owing to this under-fill material, a difference in thermal-responsive behavior between the semiconductor element and the adherend can be reduced, so that a semiconductor device, whose joint is inhibited from being broken and thereby having a high connection reliability, can be obtained. Since optimum relaxation of mutually acting stress of the semiconductor element, the adherend and the under-fill material can be achieved, breakage of the connection member can also be suppressed, and resultantly the connection reliability of the semiconductor device can be improved.

It is preferable that the storage elastic modulus E' be 100 to 10000 [MPa] and the thermal expansion coefficient α be 10 to 200 [ppm/K]. Stress on the whole system of the semiconductor device can be efficiently relaxed as the storage elastic modulus E' and the thermal expansion coefficient α respectively fall in such range.

The storage elastic modulus E' [MPa] and the thermal expansion coefficient α [ppm/K] of the under-fill material preferably satisfy the following formula (2).

$$10000 < E' \times \alpha < 250000 \text{ [Pa/K]} \quad (2)$$

Optimum relaxation of mutual stress of the semiconductor element, the adherend and the under-fill material can be more easily achieved with the storage elastic modulus E' and the thermal expansion coefficient α of the under-fill material after heat curing satisfying the formula (2).

The glass transition temperature (Tg) of the under-fill material after heat curing treatment at 175° C. for an hour is preferably 100 to 180° C., more preferably 130 to 170° C. By ensuring that the glass transition temperature of the under-fill material after heat curing falls within the range, an abrupt change in properties within a temperature range in a heat cycle reliability test can be suppressed, so that a further improvement in reliability can be expected.

As a constituent material of the under-fill material, a thermoplastic resin or a thermosetting resin can be used alone, but a combination of a thermoplastic resin and a thermosetting resin is preferable.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylate copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET and PBT, a polyamideimide resin, and a fluororesin. These thermoplastic resins can be used alone, or in combination of two or more thereof. Among these thermoplastic resins, an acrylic resin, which has less ionic impurities, has a high heat resistance and can ensure the reliability of a semiconductor element, is especially preferable.

The acrylic resin is not particularly limited, and examples thereof include polymers having as a component one or more of esters of acrylic acids or methacrylic acids which have a linear or branched alkyl group having 30 or less of carbon atoms, especially 4 to 18 carbon atoms. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group and an eicosyl group.

Other monomers for forming the polymer are not particularly limited, and examples thereof include cyano group-containing monomers such as acrylonitrile, carboxyl group-containing monomers such as acrylic acid, methacrylic acid, carboxyethyl acrylate, carboxypentyl acrylate, itaconic acid, maleic acid, fumaric acid and crotonic acid, acid anhydride monomers such as maleic anhydride and itaconic anhydride, hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate and (4-hydroxymethylcyclohexyl)-methyl acrylate, sulfonic acid group-containing monomers such as styrenesulfonic acid, allylsulfonic acid, 2-(meth)acrylamide-2-methylpropanesulfonic acid, (meth)acrylamidepropanesulfonic acid, sulfopropyl(meth) acrylate and (meth)acryloyloxynaphthalenesulfonic acid, and phosphoric acid group-containing monomers such as 2-hydroxyethylacryloyl phosphate.

Examples of the thermosetting resin include a phenol resin, an amino resin, an unsaturated polyester resin, an epoxy resin, a polyurethane resin, a silicone resin and a thermosetting polyimide resin. These resins can be used alone, or in combination of two or more thereof. Particularly, an epoxy resin containing less ionic impurities that corrode a semiconductor element is preferable. A curing agent for the epoxy resin is preferably a phenol resin.

The epoxy resin is not particularly limited as long as it is generally used as an adhesive composition, and for example a difunctional epoxy resin or a polyfunctional epoxy resin such as a bisphenol A type, a bisphenol F type, a bisphenol S type, a brominated bisphenol A type, a hydrogenated bisphenol A type, a bisphenol AF type, a biphenyl type, a naphthalene type, a fluorene type, a phenol novolak type, an orthocresol novolak type, a trishydroxyphenyl methane type or a tetraphenylol ethane type, or an epoxy resin such as a hydantoin type, a trisglycidyl isocyanurate type or a glycidyl amine type is used. They can be used alone, or in combination of two or more thereof. Among these epoxy resins, a novolak type epoxy resin, a biphenyl type epoxy resin, a trishydroxyphenyl methane type resin or a tetraphenylol ethane type epoxy resin is especially preferable. This is because the aforementioned resins have a high reactivity with a phenol resin as a curing agent, and are excellent in heat resistance and so on.

Further, the phenol resin acts as a curing agent for the epoxy resin, and examples thereof include novolak type phenol resins such as a phenol novolak resin, a phenol aralkyl resin, a cresol novolak resin, a tert-butylphenol novolak resin, and a nonylphenol novolak resin, resole type phenol resins, and polyoxystyrenes such as polyparaoxystyrene. They can be used alone, or in combination of two or more thereof. Among these phenol resins, a phenol novolak resin and a phenol aralkyl resin are especially preferable. This is because the connection reliability of a semiconductor device can be improved.

For example, the epoxy resin and the phenol resin are preferably blended at such a blending ratio that the equivalent of the hydroxyl group in the phenol resin per one equivalent of the epoxy group in the epoxy resin component is 0.5 to 2.0 equivalents. More preferable is 0.8 to 1.2 equivalents. That is, if the blending ratio of the resins falls out of the aforementioned range, the curing reaction does not proceed sufficiently, so that properties of the epoxy resin cured products are easily deteriorated.

In the present embodiment, an under-fill material using an epoxy resin, a phenol resin and an acrylic resin is especially preferable. These resins have less ionic impurities and has a high heat resistance, and therefore can ensure the reliability of a semiconductor element. The blending ratio in this case is such that the mixed amount of the epoxy resin and the phenol resin is 10 to 200 parts by weight based on 100 parts by weight of the acrylic resin component.

A heat curing accelerating catalyst for the epoxy resin and the phenol resin is not particularly limited, and can be appropriately selected from known heat curing accelerating catalysts and used. The heat curing accelerating catalyst can be used alone, or in combination or two or more kinds. As the heat curing accelerating catalyst, for example, an amine-based curing accelerator, a phosphorus-based curing accelerator, an imidazole-based curing accelerator, a boron-based curing accelerator or phosphorus-boron-based curing accelerator can be used.

A flux may be added to the under-fill material 2 for removing an oxide film on the surface of a solder bump to facilitate mounting of a semiconductor element. The flux is not particularly limited, a previously known compound having an a flux action can be used, and examples thereof include diphenolic acid, adipic acid, acetylsalicylic acid, benzoic acid, benzilic acid, azelaic acid, benzylbenzoic acid, malonic acid, 2,2-bis(hydroxymethyl)propionic acid, salicylic acid, o-methoxybenzoic acid, m-hydroxybenzoic acid, succinic acid, 2,6-dimethoxymethyl paracresol, hydrazide benzoate, carbohydrazide, dihydrazide malonate, dihydrazide succinate, dihydrazide glutarate, hydrazide salicylate, dihydrazide iminodiacetate, dihydrazide itaconate, trihydrazide citrate, thiocarbohydrazide, benzophenone hydrazone, 4,4'-oxybis-benzenesulfonyl hydrazide and dihydrazide adipate. The added amount of the flux may be such an amount that the flux action is exhibited, and is normally about 0.1 to 20 parts by weight based on 100 parts by weight of the resin component contained in the under-fill material.

In this embodiment, the under-fill material 2 may be colored as necessary. In the under-fill material 2, the color shown by coloring is not particularly limited, but is preferably, for example, black, blue, red and green. For coloring, a colorant can be appropriately selected from known colorants such as pigments and dyes and used.

When the under-fill material 2 of this embodiment is preliminarily crosslinked to a degree, a polyfunctional compound that reacts with a functional group or the like at the end of the molecular chain of a polymer should be added as a crosslinker at the time of preparation. Consequently, adhesion properties under a high temperature can be improved to improve the heat resistance.

As the crosslinker, particularly polyisocyanate compounds such as tolylene diisocyanate, diphenylmethane diisocyanate, p-phenylene diisocyanate, 1,5-naphthalene diisocyanate and an adduct of a polyhydric alcohol and a diisocyanate are more preferable. Preferably, the added amount of the crosslinker is normally 0.05 to 7 parts by weight based on 100 parts by weight of the polymer. If the amount of crosslinker is more than 7 parts by weight, the adhering strength is reduced, thus being not preferable. On the other hand, if the amount of the crosslinker is less than 0.05 parts by weight, the cohesive strength becomes poor, thus being not preferable. Other polyfunctional compounds such as an epoxy resin may be included as necessary together with the above-mentioned polyisocyanate compound.

An inorganic filler can be appropriately blended with the under-fill material 2. Blending of the inorganic filler allows impartment of electrical conductivity, improvement of thermal conductivity, adjustment of a storage elastic modulus, and so on.

Examples of the inorganic filler include various inorganic powders made of ceramics such as silica, clay, plaster, calcium carbonate, barium sulfate, aluminum oxide, beryllium oxide, silicon carbide and silicon nitride, metals such as aluminum, copper, silver, gold, nickel, chromium, lead, tin, zinc, palladium and solder, or alloys, and carbon. They can be used alone, or in combination of two or more thereof. Above all, silica, particularly fused silica is suitably used.

The average particle diameter of the inorganic filler is not particularly limited, but is preferably in a range of 0.005 to 10 μm, more preferably in a range of 0.01 to 5 μm, further preferably in a range of 0.1 to 2.0 μm. If the average particle diameter of the inorganic filler is less than 0.005 μm, the flexibility of the under-fill material may be thereby depressed. On the other hand, if the average particle diameter is more than 10 μm, the particle diameter may be so large with respect to a gap sealed by the under-fill material that the sealing property is depressed. In the present invention, inorganic fillers having mutually different average particle diameters may be combined and used. The average particle diameter is a value determined by a photometric particle size analyzer (manufactured by HORIBA, Ltd.; Unit Name: LA-910).

The blending amount of the inorganic filler is preferably 10 to 400 parts by weight, more preferably 50 to 250 parts by weight, based on 100 parts by weight of the organic resin component. If the blending amount of the inorganic filler is less than 10 parts by weight, the storage elastic modulus may be reduced, thereby considerably deteriorating the stress reliability of a package. On the other hand, if the blending amount of the inorganic filler is more than 400 parts by weight, the fluidity of the under-fill material 2 may be depressed, so that the under-fill material may not sufficiently fill up raised and recessed portions of the substrate or semiconductor element, thus leading to generation of voids and cracks.

Besides the inorganic filler, other additives can be blended with the under-fill material 2 as necessary. Examples of other additives include a flame retardant, a silane coupling agent and an ion trapping agent. Examples of the flame retardant include antimony trioxide, antimony pentaoxide and a brominated epoxy resin. They can be used alone, or in combination of two or more thereof. Examples of the silane coupling agent include β-(3,4-epoxycyclohexyl)ethyltrimethoxysilane, γ-glycidoxypropyltrimethoxysilane and γ-glycidoxypropylmethyldiethoxysilane. These compounds can be used alone, or in combination of two or more thereof. Examples of the ion trapping agent include a hydrotalcite and bismuth hydroxide. They can be used alone, or in combination of two or more thereof.

In this embodiment, the minimum melt viscosity of the under-fill material 2 at 100 to 200° C. before heat curing is preferably 100 Pa·s to 20000 Pa·s inclusive, more preferably 1000 Pa·s to 10000 Pa·s inclusive. By ensuring that the minimum melt viscosity is in the above-mentioned range, penetration of a connection member 4 into the under-fill material 2 (see FIG. 2A) can be facilitated. In addition, generation of voids at the time of electrical connection of a semiconductor element 5, and protrusion of the under-fill material 2 from a space between the semiconductor element 5 and an adherend 6 can be prevented (see FIG. 2E). In addition, the measurement of the minimum melt viscosity is a value measured by a parallel plate method using a rheometer (RS-1 manufactured by HAAKE, INC.). More specifically, the melt viscosity was measured in a range from 60° C. to 200° C. under conditions of gap: 100 μm; rotation corn diameter: 20 mm; rotation speed: $10\ s^{-1}$; and temperature rise rate: 10° C./minute, and the minimum value of melt viscosities in a range from 100° C. to 200° C. obtained at this time was designated as a minimum melt viscosity.

The viscosity of the under-fill material 2 at 23° C. before heat curing is preferably 0.01 M Pa·s to 100 M Pa·s inclusive, more preferably 0.1 M Pa·s to 10 M Pa·s inclusive. The under-fill material before heat curing has a viscosity in the above-mentioned range, whereby the retention property of a semiconductor wafer 3 (see FIG. 2C) at the time of dicing and the handling property at the time of operation can be improved. In addition, the measurement of the viscosity can be performed according to the method for measuring the minimum melt viscosity.

Further, the water absorption rate of the under-fill material 2 at a temperature of 23° C. and a humidity of 70% before heat curing is preferably 1% by weight or less, more preferably 0.5% by weight or less. The under-fill material 2 has such a water absorption rate as described above, whereby absorption of moisture into the under-fill material 2 can be suppressed, so that generation of voids during mounting of the semiconductor element 5 can be more efficiently suppressed. The lower limit of the water absorption rate is preferably as low as possible, and is preferably substantially 0% by weight, more preferably 0% by weight.

The thickness of the under-fill material 2 (total thickness in the case of a multiple layer) is not particularly limited, but may be about 10 μm to 100 μm when considering the strength of the under-fill material 2 and performance of filling a space between the semiconductor element 5 and the adherend 6. The thickness of the under-fill material 2 may be appropriately set in consideration of the gap between the semiconductor element 5 and the adherend 6 and the height of the connection member.

The under-fill material 2 of the sealing sheet 10 is preferably protected by a separator (not shown). The separator has a function as a protective material for protecting the under-fill material 2 until practical use. The separator is peeled off when the semiconductor wafer 3 is attached onto the under-fill material of the sealing sheet. As the separator, polyethylene terephthalate (PET), polyethylene, polypropylene, or a plastic film or paper of which surface is coated with a release agent such as a fluorine-based release agent or a long-chain alkyl acrylate-based release agent can be used.

(Method for Producing a Sealing Sheet)

The sealing sheet 10 according to this embodiment can be prepared by, for example, preparing the back surface grinding tape 1 and the under-fill material 2 separately in advance, and finally bonding the former and the latter together. Specifically, the sealing sheet 10 can be prepared in accordance with the following procedure.

First, the base material 1a can be film formed by a previously known film formation method. Examples of the method for a film formation may include a calender film formation method, a casting method in an organic solvent, an inflation extrusion method in a closed system, a T-die extrusion method, a co-extrusion method and a dry lamination method.

Next, a pressure-sensitive adhesive composition for formation of a pressure-sensitive adhesive layer is prepared. Resins and additives as described in the term of the pressure-sensitive adhesive layer, and so on are blended in the pressure-sensitive adhesive composition. The prepared pressure-sensitive adhesive composition is applied onto the base material 1a to form a coating film, and the coating film is then dried (crosslinked by heating as necessary) under predetermined conditions to form the pressure-sensitive adhesive layer 1b. The coating method is not particularly limited, and examples thereof include roll coating, screen coating and gravure coating. For drying conditions, for example, the drying temperature is in a range of 80 to 150° C., and the drying time is in a range of 0.5 to 5 minutes. The pressure-sensitive adhesive layer 1b may be formed by applying a pressure-sensitive adhesive composition onto a separator to form a coating film, followed by drying the coating film under the aforementioned conditions. Thereafter, the pressure-sensitive adhesive layer 1b is bonded onto the base material 1a together with the separator. In this way, the back surface grinding tape 1 including the base material 1a and the pressure-sensitive adhesive layer 1b is prepared.

For example, the under-fill material 2 is prepared in the following manner. First, an adhesive composition which is a material for forming the under-fill material 2 is prepared. A thermoplastic component, an epoxy resin, various kinds of additives and so on are blended in the adhesive composition as described in the term of the under-fill material.

Next, the prepared adhesive composition is applied onto a base material separator in a predetermined thickness to form a coating film, followed by drying the coating film under predetermined conditions to form an under-fill material. The coating method is not particularly limited, and examples thereof include roll coating, screen coating and gravure coating. For drying conditions, for example, the drying temperature is in a range of 70 to 160° C., and the drying time is in a range of 1 to 5 minutes. The under-fill material may be formed by applying a pressure-sensitive adhesive composition onto a separator to form a coating film, followed by drying the coating film under the aforementioned conditions. Thereafter, the under-fill material is bonded onto the base material separator together with the separator.

Subsequently, the separator is peeled off from each of the back surface grinding tape 1 and the under-fill material 2, and the tape and the under-fill material are bonded together such that the under-fill material and the pressure-sensitive adhesive layer form a bonding surface. Bonding can be performed by, for example, heat pressure-bonding. At this time, the lamination temperature is not particularly limited and is, for example, preferably 30 to 50° C., more preferably 35 to 45° C. The linear pressure is not particularly limited and is, for example, preferably 0.98 to 196 N/cm, more preferably 9.8 to 98 N/cm. Next, the base material separator on the under-fill material is peeled off to obtain a sealing sheet according to this embodiment.

(Method for Producing a Semiconductor Device)

One embodiment of a method for producing a semiconductor device using the sealing sheet will now be described. The method for producing a semiconductor device according to this embodiment includes a bonding step of bonding together a circuit surface of a semiconductor wafer, on which a connection member is formed, and an under-fill material of the sealing sheet; a grinding step of grinding a surface opposite to the circuit surface of the semiconductor wafer; a dicing step of dicing the semiconductor wafer to form a semiconductor element with the under-fill material; and a connection step of electrically connecting the semiconductor element and the adherend through the connection member while filling a space between the adherend and the semiconductor element using the under-fill material.

[Bonding Step]

Figure 2A:
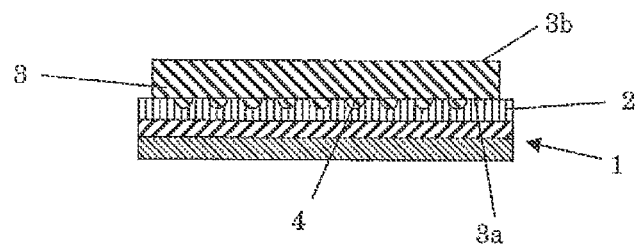
FIG. 2A is a sectional schematic view showing a step for producing a semiconductor device according to one embodiment of the present invention.

In the bonding step, a circuit surface 3a of the semiconductor wafer 3, on which the connection member 4 is formed, and the under-fill material 2 of the sealing sheet 10 are bonded (see FIG. 2A).

(Semiconductor Wafer)

A plurality of connection members 4 are formed on the circuit surface 3a of the semiconductor wafer 3 (see FIG. 2A). The material of the connection member such as a bump or an electrically conductive material is not particularly limited, and examples thereof include solders (alloys) such as a tin-lead-based metal material, a tin-silver-based metal material, a tin-silver-copper-based metal material, a tin-zinc-based metal material, a tin-zinc-bismuth-based metal material, a gold-based metal material and a copper-based metal material. The height of the connection member is also determined according to an application, and is generally about 15 to 100 μm. Of course, the heights of individual connection members in the semiconductor wafer 3 may be the same or different.

In the method for producing a semiconductor device according to this embodiment, as the thickness of the under-fill material, the height X (μm) of the connection member formed on the surface of the semiconductor wafer and the thickness Y (μm) of the under-fill material preferably satisfies the following relationship:

$$0.5 \leq Y/X \leq 2$$

The height X (μm) of the connection member and the thickness Y (μm) of the cured film satisfy the above relationship, whereby a space between the semiconductor element and the adherend can be sufficiently filled, and excessive protrusion of the under-fill material from the space can be prevented, so that contamination of the semiconductor element by the under-fill material, and so on can be prevented. When the heights of the respective connection members are different, the height of the highest connection member is used as the reference.

(Bonding)

As shown in FIG. 2A, first a separator that is optionally provided on the under-fill 2 of the sealing sheet 10 is appropriately peeled off, the circuit surface 3a of the semiconductor wafer 3, on which the connection member 4 is formed, and the under-fill material 2 are made to face to each other, and the under-fill material 2 and the semiconductor wafer 3 are bonded together (mount step).

The method for bonding is not particularly limited, but is preferably a method by pressure-bonding. Pressure-bonding is normally performed by pressing with a pressure of preferably 0.1 to 1 MPa, more preferably 0.3 to 0.7 MPa by known pressing means such as a pressure roller. At this time, pressure-bonding may be carried out while heating to about 40 to 100° C. It is also preferable to carry out pressure-bonding under a reduced pressure (1 to 1000 Pa) for improving adhesion.

[Grinding Step]

Figure 2B:
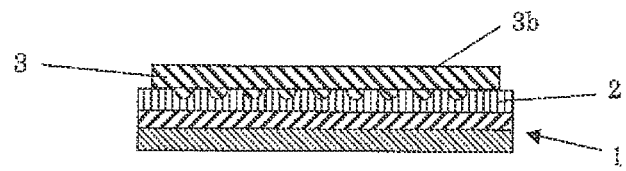
FIG. 2B is a sectional schematic view showing a step for producing a semiconductor device according to one embodiment of the present invention.

In the grinding step, a surface 3b opposite to the circuit surface 3a of the semiconductor wafer 3 (i.e. back surface) is ground (see FIG. 2B). A processor for thinning that is used for grinding the back surface of the semiconductor wafer 3 is not particularly limited, and examples thereof may include a grinding machine (back grinder) and a polishing pad. Back surface grinding may be carried out by a chemical process such as etching. Back surface grinding is carried out until the semiconductor wafer has a desired thickness (e.g. 50 to 500 μm).

[Dicing Step]

Figure 2C:
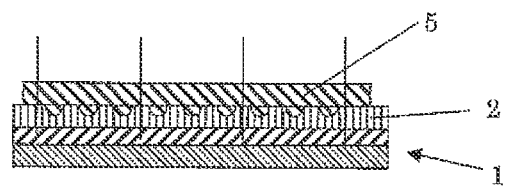
FIG. 2C is a sectional schematic view showing a step for producing a semiconductor device according to one embodiment of the present invention.

In a dicing step, as shown in FIG. 2C, the semiconductor wafer 3 is diced to form the semiconductor element 5 with an under-fill material. Through the dicing step, the semiconductor wafer 3 is cut to a predetermined size and thereby formed into individual pieces (small pieces) to produce a semiconductor chip (semiconductor element) 5. The semiconductor chip 5 thus obtained is integrated with the under-fill material 2 cut in the same shape. Dicing is carried out from the surface 3b opposite to the circuit surface 3a of the semiconductor wafer 3, to which the under-fill material 2 is bonded, in accordance with a usual method. Alignment of cut areas can be performed by image recognition using direct light or indirect light or infrared rays (IR).

In this step, for example, a cutting method called full cut, in which cutting is made to a sealing sheet, can be employed. The dicing device used in this step is not particularly limited, and one that is previously known can be used. The semiconductor wafer is adhesively fixed with excellent adhesion by a sealing sheet having an under-fill material, so that chipping and chip fly can be suppressed, and also damage of the semiconductor wafer can be suppressed. When the under-fill material is formed from a resin composition containing an epoxy resin, occurrence of glue protrusion of the under-fill material at the cut surface can be suppressed or prevented even though the under-fill material is cut by dicing. As a result, reattachment of cut surfaces (blocking) can be suppressed or prevented, so that pickup described later can be further satisfactorily performed.

When expanding of the sealing sheet is carried out subsequently to the dicing step, the expanding can be carried out using a previously known expanding device. The expanding device has a doughnut-like outer ring capable of pushing down the sealing sheet via a dicing ring, and an inner ring having a diameter smaller than that of the outer ring and supporting the sealing sheet. Owing to the expanding step, adjacent semiconductor chips can be prevented from contacting with each other and being damaged in a pickup step described later.

[Pickup Step]

Figure 2D:
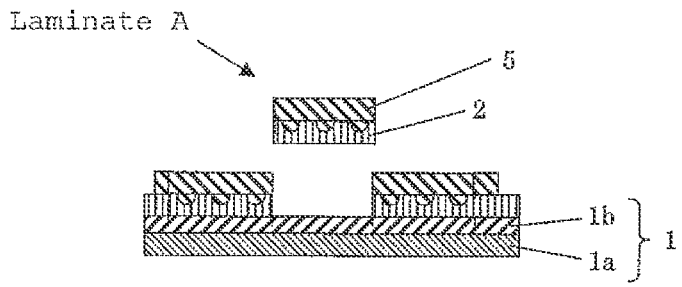
FIG. 2D is a sectional schematic view showing a step for producing a semiconductor device according to one embodiment of the present invention.
Figure 2E:
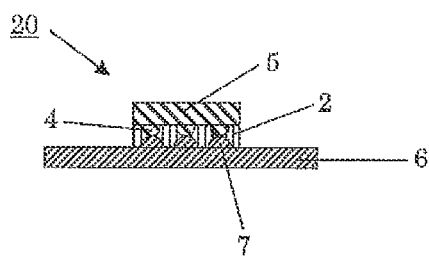
FIG. 2E is a sectional schematic view showing a step for producing a semiconductor device according to one embodiment of the present invention.

As shown in FIG. 2D, pickup of the semiconductor chip 5 with the under-fill material 2 is carried out to peel off a laminate A of the semiconductor chip 5 and the under-fill material 3 from the base material 1 for collecting the semiconductor chip 5 adhesively fixed on the sealing sheet.

The method for pickup is not particularly limited, and previously known various methods can be employed. Mention is made of, for example, a method in which individual semiconductor chips are pushed up by a needle from the base material side of the sealing sheet, and the semiconductor chips, which have been pushed up, are collected by a pickup device. The semiconductor chip 5, which has been picked up, is integrated with the under-fill material 2 bonded to the circuit surface 3a to form the laminate A.

Here, pickup is performed after irradiating the pressure-sensitive adhesive layer 1b with ultraviolet rays when the pressure-sensitive adhesive layer 1b is of an ultraviolet-ray curing-type. Consequently, adhesive power of the pressure-sensitive adhesive layer 1b to the under-fill material 2 decreases, so that it becomes easy to peel off the semiconductor chip 5. As a result, pickup can be performed without damaging the semiconductor chip 5. Conditions such as an irradiation intensity and an irradiation time for irradiation of ultraviolet rays are not particularly limited, and may be appropriately set as necessary. As a light source used for irradiation of ultraviolet rays, for example, a low-pressure mercury lamp, a low-pressure high-power lamp, a medium-pressure mercury lamp, an electrodeless mercury lamp, a xenon flash lamp, an excimer lamp, an ultraviolet LED or the like can be used.

[Mounting Process]

In the mounting process, the semiconductor element 5 and the adherend 6 are electrically connected through the connection member 4 while filling a space between the adherend 6 and the semiconductor element 5 using the under-fill material 2 (see FIG. 2 E). Specifically, the semiconductor chip 5 of the laminate A is fixed to the adherend 6 in accordance with a usual method in such a form that the circuit surface 3a of the semiconductor chip 5 is made to face to the adherend 6. For example, the bump (connection member) 4 formed on the semiconductor chip 5 is contacted with an electrically conductive material 7 (solder or the like) for bonding, which is attached to the connection pad of the adherend 6, and the electrically conductive material is melted while pressing, whereby electrical connection between the semiconductor chip 5 and the adherend 6 can be provided to fix the semiconductor chip 5 to the adherend 6. Since the under-fill material 2 is bonded to the circuit surface 3a of the semiconductor chip 5, a space between the semiconductor chip 5 and the adherend 6 is filled with the under-fill material 2 concurrently with electrically connecting of the semiconductor chip 5 and the adherend 6.

Generally, in the mounting process, the temperature is 100 to 300° C. as a heating condition, and the pressure is 0.5 to 500 N as a pressing condition. A heat pressure-bonding treatment in the mounting process may be carried out in a multiple stage. For example, such a procedure can be employed that a treatment is carried out at 150° C. and 100 N for 10 seconds, followed by carrying out a treatment at 300° C. and 100 to 200 N for 10 seconds. By carrying out the heat pressure-bonding treatment in a multiple stage, a resin between the connection member and the pad can be efficiently removed to obtain a better metal-metal joint.

As the adherend 6, a lead frame, various kinds of substrates such as and a circuit substrate (such as a wiring circuit substrate), and other semiconductor elements can be used. Examples of the material of the substrate include, but are not limited to, a ceramic substrate and a plastic substrate. Examples of the plastic substrate include an epoxy substrate, a bismaleimide triazine substrate, a polyimide substrate and a glass epoxy substrate.

In the mounting process, one or both of the connection member and the electrically conductive material are melted to connect the bump 4 of the connection member forming surface 3a of the semiconductor chip 5, and the electrically conductive material 7 on the surface of the adherend 6, and the temperature at which the bump 4 and the electrically conductive material 7 are melted is normally about 260° C. (for example 250° C. to 300° C.). The sealing sheet according to this embodiment can be made to have a such a heat resistance that it can endure a high temperature in the mounting process, by forming the under-fill material 2 from an epoxy resin or the like.

[Under-Fill Material Curing Step]

After performing electrical connection between the semiconductor element 5 and the adherend 6, the under-fill material is cured by heating. Consequently, the surface of the semiconductor element 5 can be protected, and connection reliability between the semiconductor element 5 and the adherend 6 can be ensured. The heating temperature for curing the under-fill material is not particularly limited, and may be about 150 to 250° C. When the under-fill material is also cured by a heating treatment in a mounting process, this step can be omitted.

[Sealing Step]

Next, a sealing step may be carried out for protecting the whole of a semiconductor device 20 including the mounted semiconductor chip 5. The sealing step is carried out using a sealing resin. The sealing conditions at this time are not particularly limited, and normally the sealing resin is heat-cured by heating at 175° C. for 60 seconds to 90 seconds, but the present invention is not limited thereto and, for example, the sealing resin may be cured at 165° C. to 185° C. for several minutes.

The sealing resin is not particularly limited as long as it is a resin having an insulating property (insulating resin), and can be selected from sealing materials such as known sealing resins and used, but an insulating resin having elasticity is more preferable. Examples of the sealing resin include a resin composition containing an epoxy resin. Examples of the epoxy resin include the epoxy resins described previously as an example. The sealing resin by the resin composition containing an epoxy resin may contain, as a resin component, a thermosetting resin (phenol resin, etc.), a thermoplastic resin and so on in addition to an epoxy resin. The phenol resin can also be used as a curing agent for the epoxy resin, and examples of such a phenol resin include the phenol resins described previously as an example.

[Semiconductor Device]

A semiconductor device obtained using the sealing sheet will now be described with reference to the drawings (see FIG. 2D). In the semiconductor device 20 according to this embodiment, the semiconductor element 5 and the adherend 6 are electrically connected through the bump (connection member) 4 formed on the semiconductor element 5 and the electrically conductive material 7 provided on the adherend 6.

The under-fill material 2 is placed between the semiconductor element 5 and the adherend 6 so as to fill a space therebetween. The semiconductor device 20 is obtained by the above-mentioned production method using the sealing sheet 10 having the under-fill material, and therefore, stress generated among the semiconductor element 5, the under-fill material 2 and the adherend 6 is suppressed. Thus, filling of a space between the semiconductor element 5 and the adherend 6 is kept at an adequate level, so that high reliability can be exhibited as the semiconductor device 20.

Second Embodiment

A sheet-like sealing composition according to a second embodiment as one embodiment of the present invention includes a thermoplastic resin having a weight average molecular weight of 100000 or more; an epoxy resin; a curing accelerator; and a carboxyl group-containing compound having a pKa of 3.5 or more. One embodiment of the present invention will be described below with reference to drawings as necessary.

(Thermoplastic Resin Having a Weight Average Molecular Weight of 100000 or More)

As a thermoplastic resin, a thermoplastic resin constituting the under-fill material of the first embodiment can be suitably employed. The weight average molecular weight at this time is 100000 or more.

The weight average molecular weight of the thermoplastic resin is not particularly limited as long as it is 100000 or more, and a weight average molecular weight appropriate to the properties of various kinds of resins can be imparted in consideration of the flexibility, post-curing tackiness, post-curing strength and the like of the sealing composition. For example, in the case of the acrylic resin described above, the weight average molecular weight is preferably 100000 to 3000000, more preferably 500000 to 1000000. The weight average molecular weight can be measured using the following method. A sample is dissolved in THF at a concentration of 0.1 wt %, and a weight average molecular weight is determined in terms of polystyrene conversion using GPC (gel permeation chromatography). Detailed measurement conditions are as follows.
<Conditions for Measurement of Weight Average Molecular Weight>
GPC System: HLC-8120GPC manufactured by TOSOH CORPORATION Column: (GMHHR-H)+(GMHHR-H)+(G2000HHR) manufactured by TOSOH CORPORATION
Flow rate: 0.8 ml/min
Concentration: 0.1 wt %
Injection rate: 100 µl
Column temperature: 40° C.
Eluant: THF The contained amount of the thermoplastic resin is not particularly limited, and may be determined in consideration of the flexibility, post-curing tackiness, post-curing strength and the like of the sealing composition. The contained amount of the thermoplastic resin is preferably 5 to 150 parts by weight, more preferably 10 to 100 parts by weight, based on 100 parts by weight of the epoxy resin to be described later.

The glass transition temperature (Tg) of the thermoplastic resin is preferably −40 to 20° C., more preferably −30 to 0° C. from the viewpoint of impartment of a flexibility to the sheet-like sealing composition. For the method for measuring a glass transition temperature, a thermoplastic resin formed in the shape of a film is cutout using a cutter knife into a strip having a thickness of 200 µm, a length of 400 mm (measurement length) and width of 10 mm, and a storage elastic modulus and a loss elastic modulus at −50 to 300° C. are measured using a solid viscoelasticity measurement apparatus (RSA III manufactured by Rheometric Scientific Co., Ltd.). For measurement conditions, the frequency is 1 Hz and the temperature rising rate is 10° C./min. Further, a value of tan δ (G" (loss elastic modulus)/G' (storage elastic modulus)) is calculated to thereby obtain a glass transition temperature.
(Epoxy Resin)

For the epoxy resin, an epoxy resin in the under-fill material according to the first embodiment can be suitably used.

The contained amount of the epoxy resin is not particularly limited, and is preferably 10 to 80% by weight, more preferably 20 to 50% by weight, based on the total weight of total resins in the sealing composition (including the weight of a phenol-based curing agent if it is contained) from the viewpoint of ensuring the heat resistance of the sealing composition and the elastic modulus at a high temperature.

The epoxy resin has an epoxy equivalent of preferably 100 to 300 g/eq, more preferably 150 to 200 g/eq. By ensuring that the epoxy equivalent of the epoxy resin falls within the above-mentioned range, the heat resistance can be further improved.
(Curing Accelerator)

The sealing composition of this embodiment contains a curing accelerator for an epoxy resin (phenol-based curing agent if it is contained). The curing accelerator is not particularly limited, and can be appropriately selected from known curing accelerators and used. The curing accelerator can be used alone or in combination of two or more kinds. As the curing accelerator, for example, an amine-based curing accelerator, a phosphorus-based curing accelerator, an imidazole-based curing accelerator, a boron-based curing accelerator and phosphorus-boron-based curing accelerator can be used.

The amine-based curing accelerator is not particularly limited, and examples thereof include monoethanolamine trifluoroborate (manufactured by Stella Chemifa Corporation) and dicyandiamide (manufactured by NACALAI TESQUE, INC.).

The phosphorus-based curing accelerator is not particularly limited, and examples thereof include triorganophosphines such as triphenylphosphine, tributylphosphine, tri(p-methylphenyl)phosphine, tri(nonylphenyl)phosphine and diphenyltolylphosphine, tetraphenylphosphonium bromide (trade name: TPP-PB), methyltriphenylphosphonium (trade name: TPP-MB), methyltriphenylphosphponium chloride (trade name: TPP-MC), methoxymethyltriphenylphosphonium (trade name: TPP-MOC) and benzyltriphenylphosphonium chloride (trade name: TPP-ZC) (all manufactured by Hokko Chemical Industry). The triphenylphosphine-based compound is preferably one that is substantially insoluble in an epoxy resin. If the compound is insoluble in an epoxy resin, heat-curing can be inhibited from excessively proceeding. Examples of the heat-curing catalyst, which has a triphenylphosphine structure and is substantially insoluble in an epoxy resin, may include methyltriphenylphosphonium (trade name TPP-MB). The term "insoluble" means that a heat-curing catalyst made of a triphenylphosphine-based compound is immiscible in a solvent made of an epoxy resin, more specifically soluble only in an amount of less than 10% by weight at a temperature range of from 10 to 40° C.

Examples of the imidazole-based curing accelerator include 2-methyl imidazole (trade name: 2MZ), 2-undecyl imidazole (trade name: C11-Z), 2-heptadecyl imidazole (trade name: C17Z), 1,2-dimethyl imidazole (trade name: 1.2DMZ), 2-ethyl-4-methyl imidazole (trade name: 2E4MZ), 2-phenyl imidazole (trade name: 2PZ), 2-phenyl-4-methyl imidazole (trade name: 2P4MZ), 1-benzyl-2-methyl imidazole (trade name: 1B2MZ), 1-benzyl-2-phenyl imidazole (trade name: 1B2PZ), 1-cyanoethyl-2-methyl imidazole (trade name: 2MZ-CN), 1-cyanoethyl-2-undecyl imidazole (trade name: C11Z-CN), 1-cyanoethyl-2-phenyl imidazoliumtrimellitate (trade name: 2PZCNS-PW), 2,4-diamino-6-[2'-methylimidazolyl-(1')]-ethyl-s-triazine (trade name: 2MZ-A), 2,4-diamino-6-[2'-undecylimidazolyl-(1')]-ethyl-s-triazine (trade name: C11Z-A), 2,4-diamino-6-[2'-ethyl-4'-methylimidazolyl-(1')]-ethyl-s-triazine (trade name: 2E4MZ-A), a 2,4-diamino-6-[2'-methylimidazolyl-(1')]-ethyl-s-triazine isocyanuric acid adduct (trade name: 2MA-OK), 2-phenyl-4,5-dihydroxymethyl imidazole (trade name: 2PHZ-PW) and 2-phenyl-4-methyl-5-hydroxymethyl imidazole (trade name: 2P4 MHZ-PW) (all manufactured by Shikoku Chemicals Corporation).

The boron-based curing accelerator is not particularly limited, and examples thereof include trichloroborane.

The phosphorus-boron-based curing accelerator is not particularly limited, and examples thereof include tetraphenylphosphonium tetraphenylborate (trade name: TPP-K), tetraphenylphosphonium tetra-p-triborate (trade name: TPP-MK), benzyltriphenylphosphoniumtetraphenylborate (trade name: TPP-ZK) and triphenylphosphine triphenylborane (trade name: TPP-S) (all manufactured by Hokko Chemical Industry).

The contained amount of the curing accelerator is preferably 0.01% by weight or more and 10% by weight or less based on the total amount of the thermosetting resin (including the weight of a phenol-based curing agent if it is contained). By setting the contained amount of the curing accelerator at 0.01% by weight or more, sufficient curing can be ensured. By setting the contained amount of the curing accelerator at 10% by weight or less, production costs can be reduced. The contained amount of the curing accelerator is more preferably 0.1% by weight or more and 5% by weight or less, further preferably 0.3% by weight or more and 3% by weight or less, based on the total amount of the thermosetting resin.

(Carboxyl Group-Containing Compound Having a pKa of 3.5 or More)

The carboxyl group-containing compound contained in the sheet-like sealing composition according to this embodiment is not particularly limited as long as it is a compound containing at least one carboxyl group in each molecule, having an acid dissociation constant pKa of 3.5 or more, and having a flux function. The pKa of the carboxyl group-containing compound should be 3.5 or more, but is preferably 3.5 or more and 7.0 or less, more preferably 4.0 or more and 6.0 or less, from the viewpoint of suppression of a reaction with an epoxy resin as well as over time-stability of flexibility and performance of a flux function. When two or more carboxyl groups are present, a first dissociation constant pKa is defined as an acid dissociation constant, and the first dissociation constant pKa preferably falls within the above-mentioned range. The pKa can be determined by measuring an acid dissociation constant $Ka=[H_3O^+][B^-]/[BH]$ under the condition of a dilute aqueous solution of the carboxyl group-containing compound and using the equation of $pKa=-\log Ka$. Here, BH represents a carboxyl group-containing compound, and $B^-$ represents a conjugate base of the carboxyl group-containing compound. The pKa can be measured in such a manner that a hydrogen ion concentration is measured using a pH meter, and the pKa is calculated from the concentration of a relevant substance and the hydrogen ion concentration.

The carboxyl group-containing compound is preferably at least one selected from the group consisting of an aromatic carboxylic acid having in each molecule at least one substituent selected from the group consisting of an alkyl group, an alkoxy group, an aryloxy group, an aryl group and an alkylamino group (hereinafter, referred to merely as "aromatic carboxylic acid" in some cases), and an aliphatic carboxylic acid having in each molecule one or more carboxyl group and having a carbon number of 8 or more (hereinafter, referred to merely as "aliphatic carboxylic acid" in some cases).

(Aromatic Carboxylic Acid)

The aromatic carboxylic acid is not particularly limited as long as it has in each molecule at least one substituent selected from the group consisting of an alkyl group, an alkoxy group, an aryloxy group, an aryl group and an alkylamino group. The backbone of the aromatic carboxylic acid, excluding the above-mentioned substituent, is not particularly limited, and examples thereof include benzoic acid and naphthalenecarboxylic acid. The aromatic carboxylic acid has the above-mentioned substituent on the aromatic ring of these backbones. Above all, benzoic acid is preferable as the backbone of the aromatic carboxylic acid from the viewpoint of stability in the sheet-like sealing composition and low reactivity with an epoxy resin.

The aromatic carboxylic acid is preferably a benzoic acid derivative in which at least one of hydrogen atoms specifically at 2-, 4- and 6-positions are independently substituted with an alkyl group, an alkoxy group, an aryloxy group, an aryl group or an alkylamino group (hereinafter, referred to merely as "benzoic acid derivative" in some cases). In the above-mentioned benzoic acid derivative, predetermined substituents are present alone or in combination at least one of 2-, 4- and 6-positions in benzoic acid. Examples of the specific substitution position in the benzoic acid derivative include 2-position, 4-position, 2- and 4-positions, 2- and 6-positions, and 2-, 4- and 6-positions. Above all, it is preferable to have a substituent at 2- or 4 position for suppressing a reaction with an epoxy resin, retaining the over time-stability of flexibility, and allowing a flux function to be especially efficiently performed.

Examples of the alkyl group in the aromatic carboxylic acid may include alkyl groups having a carbon number of 1 to 10, such as a methyl group, an ethyl group, an n-propyl group, an i-propyl group, an n-butyl group, an i-butyl group, a sec-butyl group, a t-butyl group, an n-pentyl group, an n-hexyl group, an n-heptyl group and an n-octyl group. Among them, a methyl group or an ethyl group is preferable from the viewpoint of adjustment of a pKa and performance of a flux function.

Examples of the alkoxy group include alkoxy groups having a carbon number of 1 to 10, such as a methoxy group, an ethoxy group, an n-propoxy group, an n-butoxy group, an n-hexanoxy group, an i-propoxy group, an n-butoxy group, a 2-methylpropoxy group and a t-butoxy group, but among them, an alkoxy group having a carbon number of 1 to 4 is preferable, a methoxy group and an ethoxy group are further preferable, and a methoxy group is especially preferable, from the same viewpoint as described above.

Examples of the aryloxy group include a phenoxy group and a p-triloxy group, and a phenoxy group is preferable from the same viewpoint as described above.

Examples of the aryl group include aryl groups having a carbon number of 6 to 20, such as a phenyl group, a toluoyl group, a benzyl group, a methylbenzyl group, a xylyl group, a mesityl group, a naphthyl group and an anthryl group, and a phenyl group is preferable from the same viewpoint as described above.

As the alkylamino group, an amino group having as a substituent an alkyl group having a carbon number of 1 to 10 can be suitably used. Specific examples of the alkylamino group include a methylamino group, an ethylamino group, a propylamino group, a dimethylamino group, a diethylamino group and a dipropylamino group, and a dimethylamino group is preferable from the same viewpoint as described above.

In the alkyl group, alkoxy group, aryloxy group, aryl group or alkylamino group described above, one or more hydrogen atoms may be each independently substituted. Examples of such additional substituent include alkoxy groups having a carbon number of 1 to 4, such as a methoxy group, an ethoxy group, an n-propoxy group, an i-propoxy group, an n-butoxy group, a 2-methylpropoxy group, a 1-methylpropoxy group and a t-butoxy group, a cyano group, cyanoalkyl groups having a carbon number of 2 to 5 such as a cyanomethyl group, a 2-cyanoethyl group, a 3-cyanopropyl group and a 4-cyanobutyl group, alkoxycarbonyl groups having a carbon number of 2 to 5, such as a methoxycarbonyl group, an ethoxycarbonyl group and a t-butoxycarbonyl group, alkoxycarbonylalkoxy groups having a carbon number of 3 to 6, such as a methoxycarbonylmethoxy group, an ethoxycarbonylmethoxy group and a t-butoxycarbonylmethoxy group, halogen atoms such as fluorine and chlorine, and fluoroalkyl groups such as a fluoromethyl group, a trifluoromethy group and a pentafluoroethyl group.

As a benzoic acid derivative having a specific combination of substitution position and a substituent, 2-aryloxybenzoic acid, 2-arylbenzoic acid, 4-alkoxybenzoic acid and 4-alkylaminobenzoic acid are preferable.

The benzoic acid derivative preferably contains no hydroxyl group. By eliminating a hydroxyl group which can be a point of reaction with an epoxy group, the sealing composition can retain a flexibility over time, and suitably exhibit a flux function.

(Aliphatic Carboxylic Acid)

The aliphatic carboxylic acid is not particularly limited, and may be any of a chain aliphatic (mono)carboxylic acid, a cycloaliphatic (mono) carboxylic acid, a chain aliphatic polyvalent carboxylic acid and a cycloaliphatic polyvalent carboxylic acid. Those forms may be combined and used.

Examples of the chain aliphatic (mono)carboxylic acid include saturated aliphatic acids such as octanoic acid, nonanoic acid, decanoic acid, dodecanoic acid, tetradecanoic acid, hexadecanoic acid, heptadecanoic acid and octadecanoic acid, and unsaturated aliphatic acids such as oleic acid, elaidic acid, erucic acid, nervonic acid, linolenic acid, stearidonic acid, eicosapentaenoic acid, linoleic acid and linolenic acid.

Examples of the cycloaliphatic (mono)carboxylic acid include monocyclic carboxylic acids such as cycloheptanecarboxylic acid and cyclooctanecarboxylic acid, and polycyclic or bridged cycloaliphatic carboxylic acids having a carbon number of 8 to 20, such as norbornanecarboxylic acid, tricyclodecanecarboxylic acid, tetracyclododecanecarboxylic acid, adamantanecarboxylic acid, methyladamantanecarboxylic acid, ethyladamantanecarboxylic acid and butyladamantanecarboxylic acid.

Examples of the chain aliphatic polyvalent carboxylic acid include carboxylic acids with one or more carboxyl group further added to the chain aliphatic (mono) carboxylic acid, and among them, chain aliphatic dicarboxylic acids are preferable in that reactivity with an epoxy resin is low and a flux function is suitably exhibited. Examples of the chain aliphatic dicarboxylic acid include octanedioic acid, nonanedioic acid, decanedioic acid, dodecanedioic acid, tetradecanedioic acid, hexadecanedioic acid, heptadecanedioic acid and octadecanedioic acid, and among them, a chain aliphatic dicarboxylic acid having a carbon number of 8 to 12 is preferable.

Examples of the cycloaliphatic polyvalent carboxylic acid include carboxylic acids with one or more carboxyl group further added to the cycloaliphatic (mono) carboxylic acid, and among them, cycloaliphatic dicarboxylic acids are preferable from the viewpoint of low reactivity to an epoxy resin and performance of a flux function. Examples of the cycloaliphatic dicarboxylic acid include monocyclic dicarboxylic acids such as cyclohexanedicarboxylic acid, cycloheptanedicarboxylic acid and cyclooctanedicarboxylic acid, and polycyclic or bridged cycloaliphatic dicarboxylic acids such as norbornanedicarboxylic acid and adamantanedicarboxylic acid.

In the aliphatic carboxylic acid having a carbon number of 8 or more, one or more hydrogen atoms may be substituted with the additional substituent.

The added amount of a carboxyl group-containing compound as a flux agent may be such an amount that the flux function is exhibited, and is preferably 0.1 to 20% by weight, more preferably 0.5 to 10% by weight based on the total weight of the sealing composition.

(Phenol-Based Curing Agent)

The sealing composition according to this embodiment preferably contains a phenol-based curing agent. The phenol-based curing agent acts as a curing agent for the epoxy resin, and a phenol resin constituting the under-fill material of the first embodiment can be suitably employed.

It is preferred that the epoxy resin and the phenol-based curing agent be blended at such a ratio that for example, the equivalent of hydroxyl group in the phenol-based curing agent is 0.5 to 2.0 per 1 equivalent of epoxy group in the epoxy resin component. It is more preferred that the above-mentioned equivalent of hydroxyl group be 0.8 to 1.2. That is, if the blending ratio of the epoxy resin and the phenol-based curing agent falls out of the aforementioned range, a curing reaction does not sufficiently proceed, so that the properties of the epoxy resin cured products are easily deteriorated.

In this embodiment, a sealing composition using an epoxy resin, a phenol-based curing agent and an acrylic resin is especially preferable. These resins have less ionic impurities and a high heat resistance, and therefore can ensure the reliability of a semiconductor element. The blending ratio in this case is such that the mixed amount of the epoxy resin and the phenol-based curing agent is 50 to 1000 parts by weight based on 100 parts by weight of the acrylic resin component.

(Other Components)

The sealing composition may contain an inorganic filler, other thermosetting resins, a crosslinker and so on in addition to the components described above.

(Inorganic Filler)

As an inorganic filler, the inorganic filler in the under-fill material according to the first embodiment can be suitably used. The average particle diameter and the blending amount of the inorganic filler can be suitably made same as those in the first embodiment.

(Other Thermosetting Resins)

Examples of other thermosetting resins include an amino resin, an unsaturated polyester resin, a polyurethane resin, a silicone resin or a thermosetting polyimide resin. These resins can be used alone or in combination of two or more kinds.

(Crosslinker)

When the sealing composition of this embodiment is crosslinked to certain extent beforehand, a polyfunctional compound that reacts with a functional group at the end of the molecular chain of a polymer, or the like, should be added as a crosslinker at the time of preparation of the sealing composition. Consequently, the tackiness property at a high temperature can be enhanced to improve the heat resistance.

As the crosslinker, the crosslinker in the under-fill material according to the first embodiment can be suitably used. The added amount of the crosslinker can be suitably made same as that in the first embodiment.

Other additives can be appropriately blended in the sealing composition as necessary. As other additives, other additives in the under-fill material according to the first embodiment can be suitably used.

In this embodiment, the sealing composition may be colored as necessary. In the sealing composition, the color took on by coloring is not particularly limited, but for example black, blue, red, green and the like are preferable. For coloring the sealing composition, a colorant can be appropriately selected from known colorants such as pigments and dyes and used.

In this embodiment, for each of the minimum melt viscosity, at 100 to 200° C., of the sheet-like sealing composition 202 before heat curing, the viscosity, at 23° C., of the sheet-like sealing composition 202 before heat curing and the water absorption rate, under conditions of temperature: 23° C. and humidity: 70%, of the sheet-like sealing composition 202 before heat curing, a range same as those for the under-fill material according to the first embodiment can be suitably employed.

The thickness of the sheet-like sealing composition (total thickness in the case of a multiple layer) is not particularly limited, but may be about 10 μm or more and 100 μm or less when considering the strength of the sealing composition and performance of filling a space between the semiconductor element 205 and the adherend 206. The thickness of the sheet-like sealing composition 202 may be appropriately set in consideration of the gap between the semiconductor element 205 and the adherend 206 and the height of the connection member.

Figure 3:
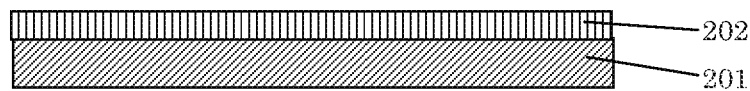
FIG. 3 is a sectional schematic view showing a sheet-like sealing composition according to one embodiment of the present invention.

The sheet-like sealing composition is preferably formed on the separator 201 as shown in FIG. 3. The separator 201 has a function as a reinforcement matrix for the sealing composition 202. For the separator 201, a base material of the separator may be directly used, or the surface of the base material may be treated with a release agent.

Examples of the material for forming the base material of the separator include polyolefins such as low-density polyethylene, linear polyethylene, medium-density polyethylene, high-density polyethylene, very low-density polyethylene, random copolymerized polypropylene, block copolymerized polypropylene, homo polypropylene, polybutene and polymethylpentene, an ethylene-vinyl acetate copolymer, an ionomer resin, an ethylene-(meth)acrylic acid copolymer, an ethylene-(meth)acrylate (random, alternating) copolymer, an ethylene-butene copolymer, an ethylene-hexene copolymer, polyurethane, polyesters such as polyethylene terephthalate and polyethylene naphthalate, polycarbonate, polyimide, polyether ether ketone, polyimide, polyetherimide, polyamide, total aromatic polyamide, polyphenyl sulfide, alamid (paper), glass, glass cloth, a fluororesin, polyvinyl chloride, polyvinylidene chloride, a cellulose-based resin, a silicone resin, a metal (foil), and papers such as glassine paper.

In addition, examples of the material of the base material include polymers such as crosslinked products of the resins listed above. For the plastic film described above, an unstretched film may be used, or a film subjected to uniaxial or biaxial stretching may be used as necessary. With a sealing sheet made heat-shrinkable by stretching or the like, collection of semiconductor chips can be facilitated by reducing the bonding area of the base material 201 and the sealing composition by heat-shrinking the base material 201 of the sealing sheet after dicing.

As the release agent, a release agent such as a fluorine-based release agent or a long-chain alkyl acrylate-based release agent can be used.

(Method for Producing a Sheet-Like Sealing Composition)

The method for producing a sheet-like sealing composition according to this embodiment includes a step of forming the sheet-like sealing composition 202 on the separator 201.

Examples of the method for a film formation of the base material of the separator 201 may include a calender film formation method, a casting method in an organic solvent, an inflation extrusion method in a closed system, a T-die extrusion method, a co-extrusion method and a dry lamination method. For the material of the base material, the material described above may be used. treatment with the release agent described above may be on a surface at the sheet-like sealing composition side of the base material conducted as necessary.

As a step of forming the sheet-like sealing composition 202, mention is made for, for example, a method of carrying out a step of forming a coating layer by applying a resin composition solution as a constituent material of the sheet-like sealing composition onto the separator 201, and thereafter carrying out a step of drying the coating layer. The resin composition solution can be prepared by dissolving/dispersing a constituent component of the sealing composition in an appropriate solvent (e.g. methyl ethyl ketone, etc.).

The method for applying the adhesive composition solution is not limited, and examples thereof include methods of applying the solution using a comma coating method, a fountain method, a gravure method and the like. The coating thickness may be appropriately set so that the thickness of the under-fill material which is finally obtained by drying the coating layer falls within the range described above. Further, the viscosity of the adhesive composition solution is not particularly limited, and is preferably 400 to 2500 mPa·s, more preferably 800 to 2000 mPa·s at 25° C.

Drying the coating layer may be carried out in a general heating furnace, and at this time, dry air may be blown to the coating layer.

The drying time is appropriately set according to the coating thickness of the adhesive composition solution, and is in a range of normally 1 to 5 min, more preferably 2 to 4 min. If the drying time is less than 1 min, there may be a case where the curing reaction does not sufficiently proceed, so that the amount of unreacted cured component and remaining solvent increases, thus raising problems of outgassing and voids in subsequent steps. On the other hand, if the drying time is more than 5 min, the fluidity and performance of filling up a bump of the semiconductor wafer may be depressed as a result of too advanced curing reaction.

The drying temperature is not particularly limited, and is normally set to a temperature in a range of 70 to 160° C. However, in the present invention, it is preferable to elevate the drying temperature stepwise with the elapse of drying time. Specifically, for example, the drying temperature is set to a temperature in a range of 70° C. to 100° C. in an initial stage of drying (for 1 min or less just after the start of drying), and is set to a temperature in a range of 100 to 160° C. in a last stage of drying (from more than 1 min to 5 min or less). Consequently, generation of pinholes on the surface of the coating layer, which are generated when the drying temperature is rapidly elevated just after coating, can be prevented.

The separator may be bonded to the other surface of the sheet-like sealing composition, used as a protective film for the sealing sheet, and peeled off at the time of bonding to the semiconductor wafer or the like. Consequently, the sheet-like sealing composition according to this embodiment can be produced.

<Method for Producing a Semiconductor Device>

The method for producing a semiconductor device according to the present invention includes a bonding step of bonding together a surface of a semiconductor wafer, on which a connection member is formed, and the sheet-like sealing composition; a dicing step of dicing the semiconductor wafer to form a semiconductor element with the sheet-like sealing composition; and a connection step of electrically connecting the semiconductor element and the adherend through the connection member while filling a space between the adherend and the semiconductor element using the sheet-like sealing composition. One embodiment of the producing method will described below.

[Bonding Step]

Figure 4A:
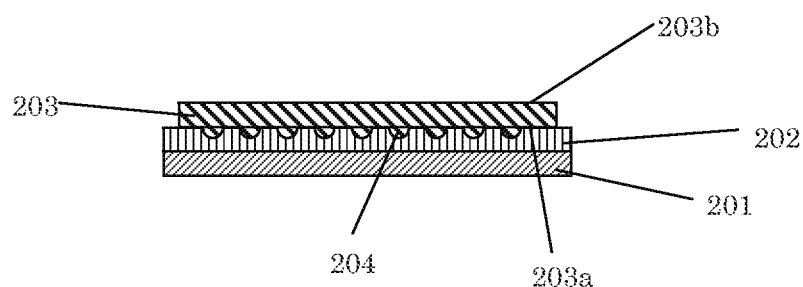
FIG. 4A is a sectional schematic view showing a step for producing a semiconductor device according to one embodiment of the present invention.

In a bonding step, a surface of the semiconductor wafer 203, on which the connection member 204 is formed, and the sheet-like sealing composition 202 are bonded together (see FIG. 4A).

(Semiconductor Wafer)

As the semiconductor wafer 203, a plurality of connection members 204 may be formed on one surface 203a (see FIG. 4A), or connection members may be formed on both surfaces 203a and 203b of the semiconductor wafer 203 (not shown). For the material and structure of the connection member such as a bump or an electrically conductive material, and the relationship between the height X of the connection member and the thickness Y of the sealing composition, conditions same as those in the first embodiment can be suitably employed. The height of the connection member is generally about 10 to 60 µm.

When the connection members are formed on both surfaces of the semiconductor wafer, the connection members may or may not be electrically connected. Examples of electrical connection between connection members include connection through a via, which is called a TSV type.

(Bonding)

As shown in FIG. 4A, first a separator that is optionally provided on the sheet-like sealing composition 202 is appropriately peeled off, the surface (connection member forming surface) 203a of the semiconductor wafer 203, on which the connection member 204 is formed, and the sealing composition 202 are made to face each other, and the under-fill material 202 and the semiconductor wafer 203 are bonded together (mount step). For the pressure-bonding condition, a condition same as that in the first embodiment can be suitably employed.

[Dicing Step]

Figure 4B:
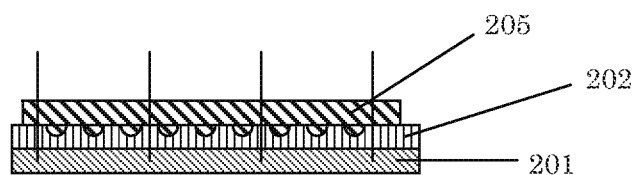
FIG. 4B is a sectional schematic view showing a step for producing a semiconductor device according to one embodiment of the present invention.

In a dicing step, as shown in FIG. 4B, a semiconductor wafer 203 is diced to form a semiconductor element 205 with an sealing composition 202. Through the dicing step, the semiconductor wafer 203 is cut to a predetermined size and thereby formed into individual pieces (small pieces) to produce a semiconductor chip (semiconductor element) 205. The semiconductor chip 205 thus obtained is integrated with the sealing composition 202 cut in the same shape. Dicing is carried out from the surface 203b opposite to the surface 203a of the semiconductor wafer 203, to which the sealing composition is bonded, in accordance with a usual method. Alignment of cut areas can be performed by image recognition using direct light or indirect light or infrared rays (IR).

In this step, a cutting method, an expanding condition and the like, which are same as those in the first embodiment, can be used.

[Pickup Step]

Figure 4C:
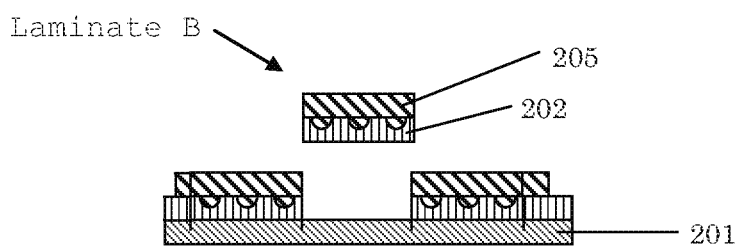
FIG. 4C is a sectional schematic view showing a step for producing a semiconductor device according to one embodiment of the present invention.

As shown in FIG. 4C, pickup of the semiconductor chip 205 with the sheet-like sealing composition 202 is carried out to peel off a laminate B of the semiconductor chip 205 and the sheet-like sealing composition 202 from the separator 201 for collecting the semiconductor chip 205 with the sheet-like sealing composition 202. As a method for performing pickup, a method same as that in the pickup step of the first embodiment can be suitably employed.

[Connection Step]

Figure 4D:
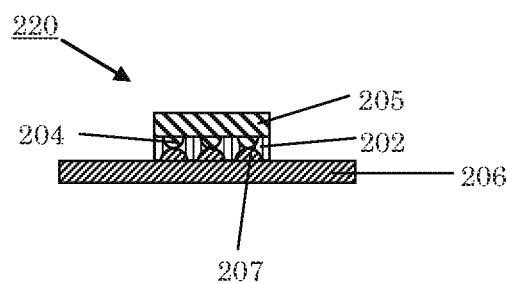
FIG. 4D is a sectional schematic view showing a step for producing a semiconductor device according to one embodiment of the present invention.

In a connection step, the semiconductor element and the adherend are electrically connected through the connection member while filling a space between the adherend and the semiconductor element with the sealing composition (so called a mounting process; see FIG. 4D). Specifically, the semiconductor chip 205 of the laminate B is fixed to the adherend 206 in accordance with a usual method in such a form that the connection member forming surface 203a of the semiconductor chip 205 is made to face the adherend 206. For example, the bump (connection member) 204 formed on the semiconductor chip 205 is contacted with an electrically conductive material 207 (solder or the like) for bonding, which is attached to the connection pad of the adherend 206, and pressed while the electrically conductive material is melted, whereby electrical connection between the semiconductor chip 205 and the adherend 206 can be provided to fix the semiconductor chip 205 to the adherend 206. At this time, the sheet-like sealing composition 202 contains a predetermined carboxyl group-containing compound, and a reaction with an epoxy resin is inhibited also by heat at the time of mounting, so that a flux function can be sufficiently exhibited. Thus, since the sealing composition 202 is bonded to the connection member forming surface 203a of the semiconductor chip 205, a space between the semiconductor chip 205 and the adherend 206 can be efficiently filled concurrently with electrical connecting of the semiconductor chip 205 and the adherend 206. Through the connection step, the sealing composition is cured.

As the adherend 206, an adherend same as that in the first embodiment can be suitably employed.

In the connection step, one or both of the connection member and the electrically conductive material are melted to connect the bump 204 of the connection member forming surface 203a of the semiconductor chip 205, and the electrically conductive material 207 on the surface of the adherend 206, and the temperature at which the bump 204 and the electrically conductive material 207 are melted is normally about 220° C. (for example 160° C. to 300° C.). The sealing composition according to this embodiment is formed of an epoxy resin or the like and thus, can be made to have a such a heat resistance that a high temperature in the mounting process can be endured.

Next, a sealing step may be carried out for protecting the whole of a semiconductor device 220 including the mounted semiconductor chip 205. In the sealing step, a sealing resin and a sealing condition, which are same as those in the first embodiment, can be suitably employed.

[Semiconductor Device]

A semiconductor device obtained using the sealing sheet will now be described with reference to the drawings (see FIG. 4D). In the semiconductor device 220 according to this embodiment, the semiconductor element 205 and the adherend 206 are electrically connected through the bump (connection member) 204 formed on the semiconductor element 205 and the electrically conductive material 207 provided on the adherend 206. The sealing composition 202 is placed between the semiconductor element 205 and the adherend 206 so as to fill a space therebetween. The semiconductor device 220 is obtained by the above-mentioned production method using the sealing composition 202, and therefore joining between the bump 204 of the semiconductor element 205 and the adherend 206 are satisfactorily performed. Thus, protection of the surface of the semiconductor element 205 and filling of a space between the semiconductor element 205 and the adherend 206 are kept at an adequate level, so that high reliability can be exhibited as the semiconductor device 220.

Third Embodiment

The present invention is a method for producing a semiconductor device including an adherend, a semiconductor element electrically connected to the adherend, and an under-fill material that fills a space between the adherend and the semiconductor element, wherein the method includes: a position matching step of irradiating oblique light to an exposed surface of an under-fill material bonded to a circuit surface of a semiconductor element and having a total light transmittance of 50% or more, and matching a relative position of the semiconductor element and the adherend to a predetermined position for connection of each other; and a connection step of electrically connecting the semiconductor element and the adherend through the connection member while filling a space between the adherend and the semiconductor element using the under-fill material. A third embodiment as one embodiment of the present invention will be described below.

In the third embodiment, as a preliminary step for the position matching step, griding the back surface of a semiconductor wafer using a sealing tape including an under-fill material laminated on a back surface grinding tape, followed by carrying out dicing on a dicing tape, and picking up of a semiconductor element. Typical steps include a providing step of providing a sealing sheet including a back surface grinding tape and an under-fill material laminated on the back surface grinding tape and having a total light transmittance of 50% or more, a bonding step of bonding together a circuit surface of a semiconductor wafer, on which a connection member is formed, and the under-fill material of the sealing sheet, a grinding step of grinding the back surface of the semiconductor wafer, a fixation step of peeling off the semiconductor wafer together with the under-fill material from the back surface grinding tape and bonding the semiconductor wafer to a dicing tape, a dicing step of dicing the semiconductor wafer to form a semiconductor element with the under-fill material, and a pickup step of peeling off the semiconductor element with the under-fill material from the dicing tape. These preliminary steps, the position matching step and the subsequent steps will be described below.

[Providing Step]

In the providing step, a sealing sheet including a back surface grinding tape and an under-fill material laminated on the back surface grinding tape and having a total light transmittance of 50% or more is provided. As a support material for the sealing sheet, a base material, a back surface grinding tape, a dicing tape or the like can be suitably used. This embodiment will be described taking as an example a case where the back surface grinding tape is used.

(Sealing Sheet)

Figure 5:
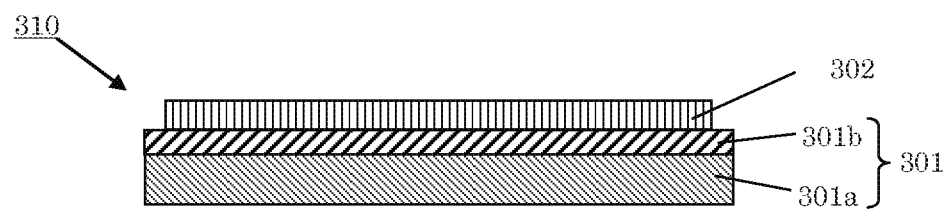
FIG. 5 is a sectional schematic view showing a sealing sheet according to one embodiment of the present invention.

As shown in FIG. 5, a sealing sheet 310 includes a back surface grinding tape 301 and an under-fill material 302 laminated on the back surface grinding tape 301. As shown in FIG. 5, the under-fill material 302 may be provided in a size sufficient for bonding to a semiconductor wafer 303 (see FIG. 6A), and may be laminated on the entire surface of the back surface grinding tape 301.

(Back Surface Grinding Tape)

As the back surface grinding tape 301, a back surface grinding tape in the first embodiment can be suitably used.

In this regard, the thickness of a pressure-sensitive adhesive layer 301b of this embodiment is not particularly limited, but is preferably about 1 to 80 μm from the viewpoint of compatibility between prevention of chipping of the ground surface of the semiconductor wafer and fixed retention of the under-fill material 302. The thickness of a pressure-sensitive adhesive layer 301b is preferably 2 to 50 μm, further preferably 5 to 35 μm.

(Under-Fill Material)

The under-fill material 302 in this embodiment can be used as a sealing film for filling a space between a surface-mounted semiconductor element and an adherend. The total light transmittance of the under-fill material 302 should be 50% or more, and is preferably 60% or more, more preferably 70% or more. A higher total light transmittance of the under-fill material 302 is more preferable, but even if the total light transmittance is only about 50%, the position of the semiconductor element can be accurately detected by utilizing irradiation of oblique light at the time of determining a dicing position for dicing and at the time of matching to the joint position for mounting.

For the constituent material and the amount thereof, properties and the like of the under-fill material, the constituent material and the amount thereof, properties and the like of the under-fill material according to the first embodiment can be suitably used.

In the present embodiment, an under-fill material using an epoxy resin, a phenol resin and an acrylic resin is especially preferable. These resins have less ionic impurities and has a high heat resistance, and therefore can ensure the reliability of a semiconductor element. The blending ratio in this case is such that the mixed amount of the epoxy resin and the phenol resin is 10 to 1000 parts by weight based on 100 parts by weight of the acrylic resin component.

(Method for Producing a Sealing Sheet)

The sealing sheet 310 according to this embodiment can be suitably prepared in accordance with a procedure same as the method for producing a sealing sheet according to the first embodiment.

[Bonding Step]

Figure 6A:
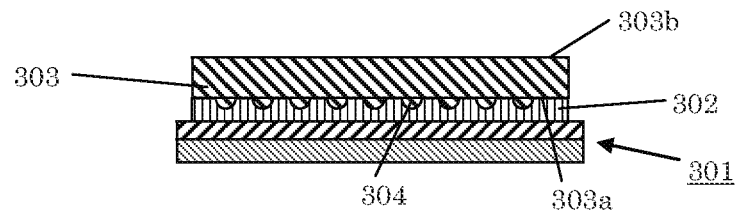
FIG. 6A is a sectional schematic view showing one of the steps for producing a semiconductor device according to one embodiment of the present invention.

In the bonding step, the circuit surface 303a of the semiconductor wafer 303, on which a connection member 304 is formed, and the under-fill material 302 of the sealing sheet 310 are bonded together (see FIG. 6A). In the bonding step, details of the semiconductor wafer and bonding conditions, which are same as those in the first embodiment, can be suitably employed.

[Grinding Step]

Figure 6B:
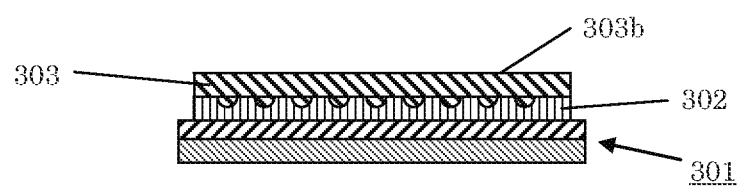
FIG. 6B is a sectional schematic view showing one of the steps for producing a semiconductor device according to one embodiment of the present invention.

In the grinding step, a surface 303b opposite to the circuit surface 303a of the semiconductor wafer 303 (i.e. back surface) is ground (see FIG. 6B). Again for the grinding step, a procedure and conditions that are same as those in the first embodiment can be employed.

[Fixation Step]

Figure 6C:
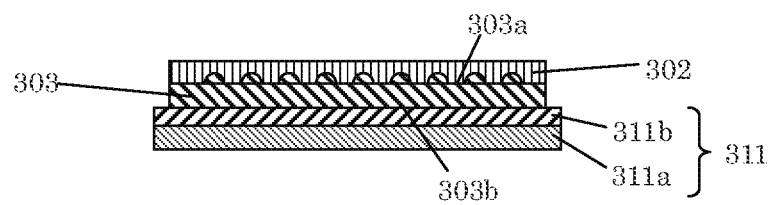
FIG. 6C is a sectional schematic view showing one of the steps for producing a semiconductor device according to one embodiment of the present invention.

After the grinding step, the semiconductor wafer 303 with the under-fill material 302 bonded thereto is peeled off from the back surface grinding tape 301, and the semiconductor wafer 303 and the dicing tape 311 are bonded together (see FIG. 6C). At this time, bonding is performed such that the back surface 303b of the semiconductor wafer 303 and a pressure-sensitive adhesive layer 311b of the dicing tape 311 are made to face to each other. Thus, the under-fill material 302 bonded to the circuit surface 303a of the semiconductor wafer 303 is exposed. The dicing tape 311 has such a structure that the pressure-sensitive adhesive layer 311b is laminated on a base material 311a. The base material 311a and the pressure-sensitive adhesive layer 311b can be suitably prepared using the components and the production method shown in the terms of the base material of the back surface grinding tape and the pressure-sensitive adhesive layer in the first embodiment.

When the semiconductor wafer 303 is peeled off from the back surface grinding tape 301, peeling can be facilitated by irradiating the pressure-sensitive adhesive layer 301b with radiations to cure the pressure-sensitive adhesive layer 301b if the case where the pressure-sensitive adhesive layer 301b has a radiation-curability. The amount of irradiation of radiations may be appropriately set in consideration of the type of radiations used and the degree of cure of the pressure-sensitive adhesive layer.

[Dicing Position Determining Step]

Figure 6D:
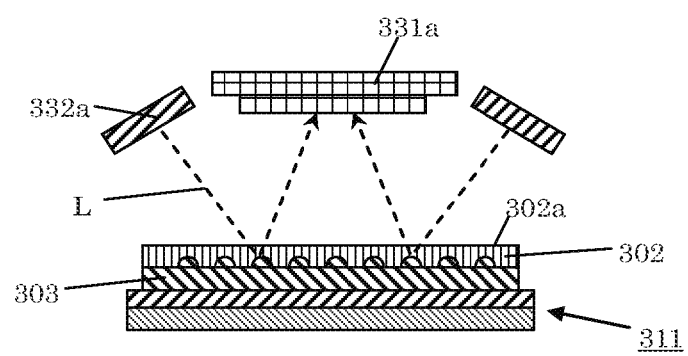
FIG. 6D is a sectional schematic view showing one of the steps for producing a semiconductor device according to one embodiment of the present invention.
Figure 7A:
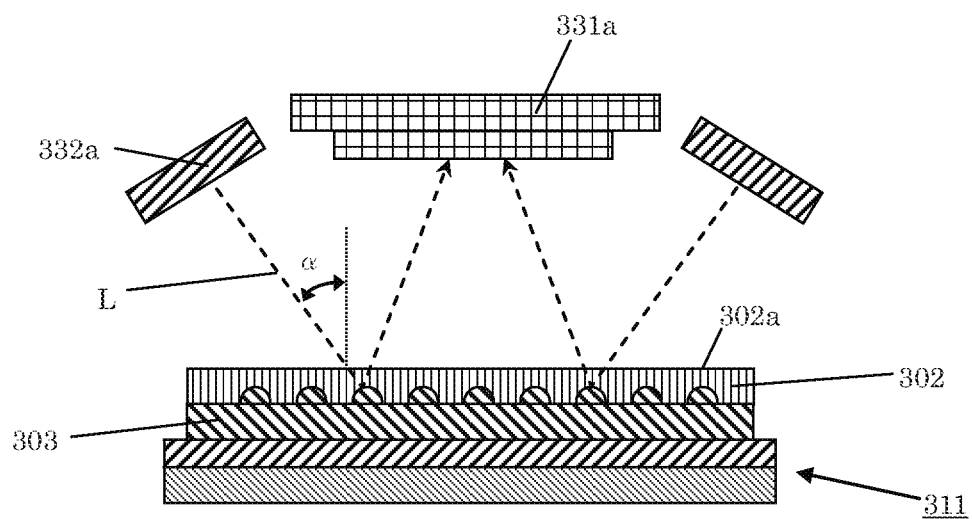
FIG. 7A is a sectional schematic view showing a dicing position determining step according to one embodiment of the present invention.

Next, in the dicing position determining step, as shown in FIGS. 6D and 7A, the exposed surface 302a of the under-fill material 302 of the semiconductor wafer 303 with the under-fill material is irradiated with oblique light L to determine a dicing position in the semiconductor wafer 303. Consequently, the dicing position of the semiconductor wafer 303 can be detected with high accuracy, and dicing of the semiconductor wafer 303 can be carried out easily and efficiently.

Specifically, an imaging device 331a and a ring illuminator (illuminator having a circular light emitting surface) 332a are placed above the semiconductor wafer 303 fixed to the dicing tape 311. Next, oblique light L is irradiated from the ring illuminator 332a to the exposed surface 302a of the under-fill material 302 at a predetermined incidence angle α. Light, which enters the under-fill material 302 and is reflected at the semiconductor wafer 303, is received as a reflected image in the imaging device 331a. The reflected image received is analyzed by an image recognition device to determine a position to be diced. Thereafter, a dicing device (e.g. dicing blade, laser generator, etc.) is moved and matched to the dicing position to complete this step (not shown).

As an illuminator for irradiation of oblique light, a ring illuminator can be suitably used as described above, but the illuminator is not limited thereto, and a line illuminator (illuminator having a linear light emitting surface), a spot illuminator (illuminator having a spotted light emitting surface) or the like can be used. The illuminator may also be an illuminator with a plurality of line illuminators combined in a polygonal form, or an illuminator with spot illuminators combined in a polygonal or ring shape.

The light source of the illuminator is not particularly limited, and examples thereof include a halogen lamp, a LED, a fluorescent lamp, a tungsten lamp, a metal halide lamp, a xenon lamp and a black light. Oblique light L irradiated from the light source may be any of parallel light and radial light (non-parallel light), but parallel light is preferable when considering irradiation efficiency and ease of setting the incidence angle α. However, there are physical limitations on irradiation of oblique light L as parallel light, the oblique light may be substantially parallel light (half-value angle: 30° or less). Oblique light L may be polarized light.

In this embodiment, the oblique light is preferably irradiated to the exposed surface of the under-fill material in two or more directions or in all directions. By irradiation of oblique light in multiple directions or all directions (all-round direction), diffused reflection from the semiconductor wafer can be increased to improve accuracy of position detection, so that accuracy of detection of the dicing position can be further improved. Irradiation in multiple directions can be performed by one of the line illuminator and spot illuminator or combination of both the illuminators. Irradiation in all directions or an all-round direction can be easily performed by combining the above-mentioned plurality of line illuminators in a polygonal form, or using a ring illuminator.

The incidence angle α is not particularly limited as long as oblique light L is irradiated obliquely to the exposed surface 302a of the under-fill material 302, but the incidence angle α is preferably 5 to 85°, more preferably 15 to 75°, especially preferably 30 to 60°. By ensuring that the incidence angle α falls within the above-mentioned range, regular reflection light from the semiconductor wafer 303, which may cause a halation phenomenon, can be prevented to improve accuracy of detection of the dicing position of the semiconductor wafer. When oblique light L is radial light (non-parallel light), some variation may occur in the incidence angle α depending on a relationship between a start point of irradiation of oblique light L and a destination at the exposed surface 302a of the under-fill material 302. In this case, an angle, at which the amount of oblique light L becomes the maximum, should fall within the above-mentioned range of incidence angle α.

The wavelength of the oblique light is not particularly limited as long as a reflected image from the semiconductor wafer 303 is obtained, and the semiconductor wafer 303 is not damaged, but the wavelength of the oblique light is preferably 300 to 900 nm, more preferably 400 to 800 nm. By ensuring that the wavelength of oblique light falls within the above-mentioned range, a good permeability is shown even for an under-fill material formed of a general material including an inorganic filler, and therefore the dicing position can be more easily detected.

In FIGS. 6D and 7A, an object to be recognized in the semiconductor wafer for detecting a position by irradiation of oblique light is the connection member (e.g. bump) 304 formed on the semiconductor wafer 303, but is not limited thereto, and the object to be recognized may be an alignment mark, a terminal, a circuit pattern or the like, or any mark or structure.

[Dicing Step]

Figure 6E:
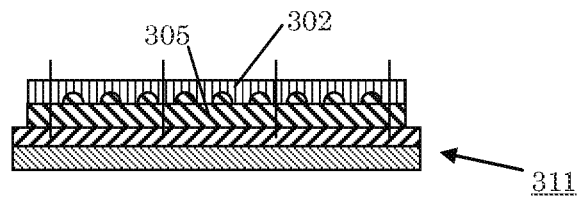
FIG. 6E is a sectional schematic view showing one of the steps for producing a semiconductor device according to one embodiment of the present invention.

In the dicing step, based on the dicing position determined in the dicing position determining step described above, the semiconductor wafer 303 and the under-fill material 302 are diced to form the semiconductor element 305 with the diced under-fill material as shown in FIG. 6E. Through the dicing step, the semiconductor wafer 303 is cut to a predetermined size and thereby formed into individual pieces (small pieces) to produce a semiconductor chip (semiconductor element) 305. The semiconductor chip 305 thus obtained is integrated with the under-fill material 302 cut in the same shape. Dicing is carried out from the circuit surface 303a of the semiconductor wafer 303, to which the under-fill material 302 is bonded, in accordance with a usual method.

In this step, for example, a cutting method called full cut, in which cutting is made to the dicing tape 311, can be employed. The dicing device used in this step is not particularly limited, and one that is previously known can be used. The semiconductor wafer is adhesively fixed with excellent adhesion by the dicing tape 311, so that chipping and chip fly can be suppressed, and also damage of the semiconductor wafer can be suppressed. When the under-fill material is formed from a resin composition containing an epoxy resin, occurrence of protrusion of glue of the under-fill material at the cut surface can be suppressed or prevented even though the semiconductor wafer is cut by dicing. As a result, reattachment of cut surfaces (blocking) can be suppressed or prevented, so that pickup described later can be further satisfactorily performed.

When expanding of the sealing sheet is carried out subsequently to the dicing step, the expanding can be carried out using a previously known expanding device. The expanding device has a doughnut-like outer ring capable of depressing the sealing sheet via a dicing ring, and an inner ring having a diameter smaller than that of the outer ring and supporting the sealing sheet. Owing to the expanding step, adjacent semiconductor chips can be prevented from contacting with each other and damaged in a pickup step described later.

[Pickup Step]

Figure 6F:
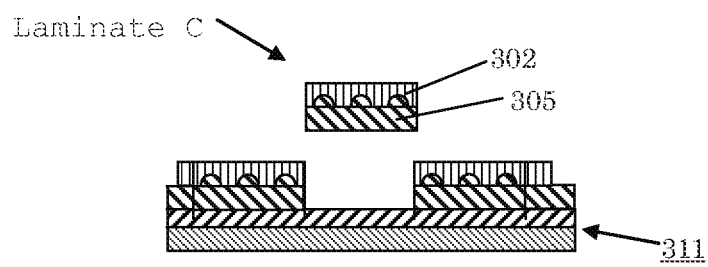
FIG. 6F is a sectional schematic view showing one of the steps for producing a semiconductor device according to one embodiment of the present invention.

As shown in FIG. 6F, pickup of the semiconductor chip 305 with the under-fill material 302 is carried out to peel off a laminate C of the semiconductor chip 305 and the under-fill material 302 from the dicing tape 311 for collecting the semiconductor chip 305 adhesively fixed on the dicing tape 311.

The method for pickup is not particularly limited, and previously known various methods can be employed. Mention is made of, for example, a method in which individual semiconductor chips are pushed up by a needle from the base material side of the laminated film, and the semiconductor chips, which have been pushed up, are collected by a pickup device. The semiconductor chip 305, which has been picked up, is integrated with the under-fill material 302 bonded to the circuit surface 303a to form the laminate C.

Here, pickup is performed after the pressure-sensitive adhesive layer 311b is irradiated with ultraviolet rays when the pressure-sensitive adhesive layer 311b is of an ultraviolet-ray curing type. Consequently, the tackiness of the pressure-sensitive adhesive layer 311b to the semiconductor chip 305 decreases, so that the semiconductor chip 305 can be easily peeled off. As a result, pickup can be performed without damaging the semiconductor chip 305. Conditions such as the irradiation intensity and the irradiation time at the time of irradiation of ultraviolet rays are not particularly limited, and may be appropriately set as necessary. As a light source used for irradiation of ultraviolet rays, for example, a low-pressure mercury lamp, a low-pressure high-power lamp, a medium-pressure mercury lamp, an electrodeless mercury lamp, a xenon flash lamp, an excimer lamp, an ultraviolet LED or the like can be used.

[Position Matching Step]

Figure 6G:
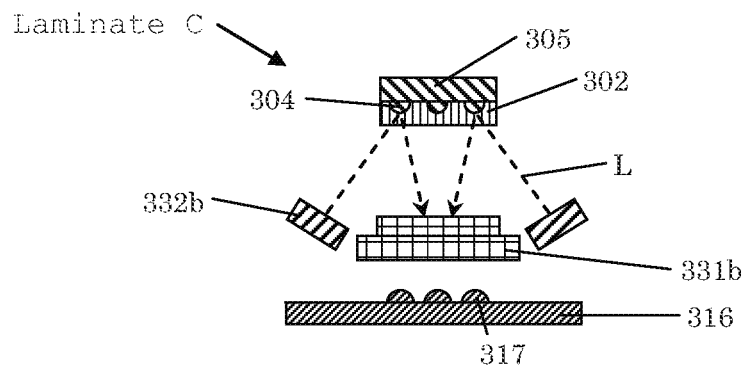
FIG. 6G is a sectional schematic view showing one of the steps for producing a semiconductor device according to one embodiment of the present invention.
Figure 7B:
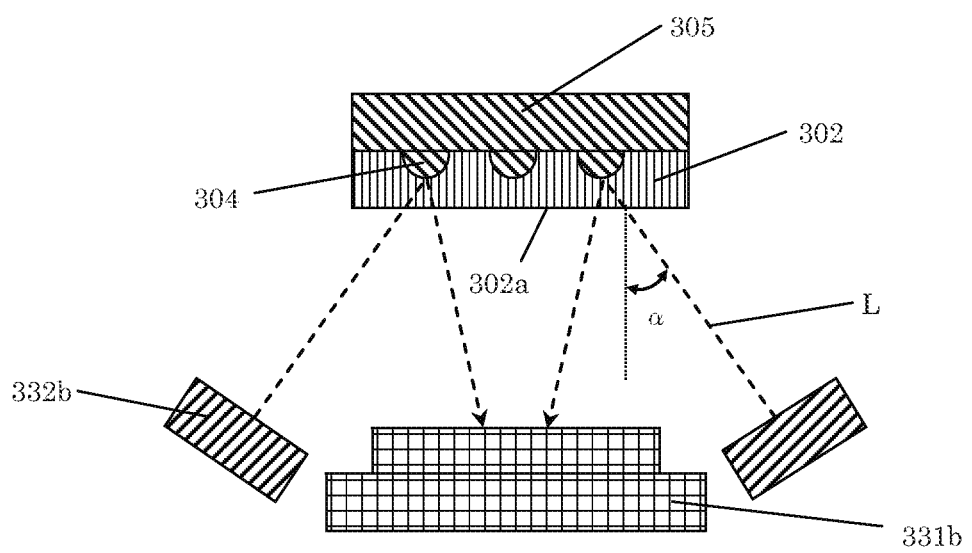
FIG. 7B is a sectional schematic view showing a position matching step according to one embodiment of the present invention.

Next, in the position matching step, as shown in FIGS. 6G and 7B, oblique light L is irradiated to the exposed surface 302a of the under-fill material 302 of the semiconductor element 305 with the under-fill material, and a relative position of the semiconductor element 305 and the adherend 316 is matched to a predetermined position for connection of each other. Consequently, the position of the semiconductor element 305 can be detected with high accuracy, and matching to the predetermined position for connection of the semiconductor element 305 and the adherend 316 can be performed easily and efficiently.

Specifically, a laminate C that is picked up is placed above the adherend 316 such that a surface of the semiconductor element 305, on which the connection member 304 is formed (corresponding to the circuit surface 303a of the semiconductor wafer 303) is made to face to the adherend 316. Then, the imaging device 331b and the ring illuminator 332b are placed between the laminate C and the adherend 316, followed by irradiating oblique light L in a predetermined incidence angle α from the ring illuminator 332b toward the laminate C with respect to the exposed surface 302a of the under-fill material 302. Light, which enters the under-fill material 302 and is reflected at the semiconductor element 305, is received as a reflected image in the imaging device 331b. Next, the reflected image received is analyzed by an image recognition device, a displacement from a previously defined predetermined position for connection is determined, and finally a laminate A is moved by the determined displacement amount to match a relative position of the semiconductor element 305 and the adherend 316 to the predetermined position for connection (not shown).

The form of irradiation of oblique light in this position matching step is different from that of irradiation of oblique light in the dicing position determining step only in that the position of the exposed surface 302a of the under-fill material and the positions of the imaging device 331b and the illuminator 332b are vertically reversed. Thus, as conditions for irradiation of oblique light, for example, an illuminator for irradiation of oblique light, a light source of the illuminator, an irradiation direction, a range of incidence angle α, a wavelength of oblique light, and an object to be recognized in the semiconductor element for position detection by irradiation of oblique light, the conditions described in the term of the dicing position determining step can be suitably employed, and a comparable effect can be obtained.

[Mounting Process]

Figure 6H:
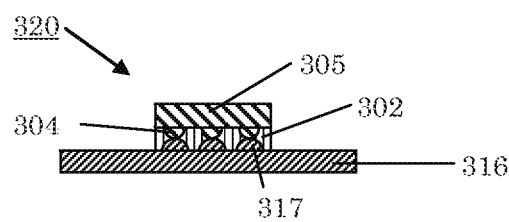
FIG. 6H is a sectional schematic view showing one of the steps for producing a semiconductor device according to one embodiment of the present invention.

In the mounting process, the semiconductor element 305 and the adherend 316 are electrically connected through the connection member 304 while filling a space between the adherend 316 and the semiconductor element 305 using the under-fill material 302 (see FIG. 6H). Specifically, the semiconductor chip 305 of the laminate C is fixed to the adherend 316 in accordance with a normal method in such a form that the circuit surface 303a of the semiconductor chip 305 is made to face to the adherend 316. For example, the bump (connection member) 304 formed on the semiconductor chip 305 is contacted with an electrically conductive material 317 (solder, etc.) for bonding, which is attached to a connection pad of the adherend 316, and pressed while the electrically conductive material is melted, whereby electrical connection between the semiconductor chip 305 and the adherend 316 can be ensured to fix the semiconductor chip 305 to the adherend 316. Since the under-fill material 302 is attached on the circuit surface 303a of the semiconductor chip 305, a space between the semiconductor chip 305 and the adherend 316 is filled with the under-fill material 302 concurrently with electrical connection of the semiconductor chip 305 and the adherend 316.

Mounting conditions, the adherend 316, the bump 304, the temperature at the time of the electrically conductive material 317 being melted and so on, which are same as those in the first embodiment, can be suitably employed.

[Under-Fill Material Curing Step]

After the semiconductor element 305 and the adherend 316 are electrically connected, the under-fill material 302 may be cured by heating if it is not sufficiently cured. In this step, conditions and so on, which are same as those in the first embodiment, can be suitably employed.

[Sealing Step]

Next, for protecting the whole of a semiconductor device 320 including the mounted semiconductor chip 305, a sealing step may be carried out. In the sealing step, a sealing resin and sealing conditions, which are same as those in the first embodiment, can be suitably employed.

[Semiconductor Device]

A semiconductor device obtained using the sealing sheet will now be described with reference to the drawings (see FIG. 6H). In the semiconductor device 320 according to this embodiment, the semiconductor element 305 and the adherend 316 are electrically connected through the bump (connection member) 304 formed on the semiconductor element 305 and the electrically conductive material 317 provided on the adherend 316. The under-fill material 302 is placed between the semiconductor element 305 and the adherend 316 so as to fill a space therebetween. The semiconductor device 320 is obtained by the predetermined under-fill material 302 and the above-mentioned production method employing the position matching by irradiation of oblique light, and therefore satisfactory electrical connection between the semiconductor element 305 and the adherend 316 can be achieved. Thus, protection of the surface of the semiconductor element 305, filling of a space between the semiconductor element 305 and the adherend 316, and electrical connection between the semiconductor element 305 and the adherend 316 are each achieved at a sufficient level, so that a high reliability can be exhibited as the semiconductor device 320.

Fourth Embodiment

A semiconductor wafer with a circuit formed on one surface is used in the third embodiment, whereas in this embodiment, a semiconductor device is produced using a semiconductor wafer with circuits formed on both surfaces. Since the semiconductor wafer used in this embodiment has an intended thickness, a grinding step is omitted. Thus, as a sealing sheet in the fourth embodiment, a sealing sheet including a dicing tape and an under-fill material laminated on the dicing tape and having a total light transmittance of 50% or more is used. Typical steps prior to a position matching step in the fourth embodiment include a providing step of providing the sealing sheet, a bonding step of bonding together a semiconductor wafer, in which circuit surfaces each having a connection member are formed on both surfaces thereof, and the under-fill material of the sealing sheet, a dicing step of dicing the semiconductor wafer to form a semiconductor element with the under-fill material, and a pickup step of peeling off the semiconductor element with the under-fill material from the sealing sheet. Thereafter, the position matching step and the subsequent steps are carried out to produce a semiconductor device.

[Providing Step]

Figure 8A:
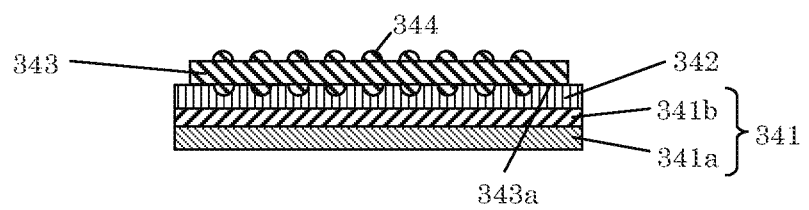
FIG. 8A is a sectional schematic view showing one of the steps for producing a semiconductor device according to another embodiment of the present invention.

In the providing step, a sealing sheet including a dicing tape 341 and an under-fill material 342 laminated on the dicing tape 341 and having a total light transmittance of 50% or more is provided (see FIG. 8A). The dicing tape 341 includes a base material 341a and a pressure-sensitive adhesive layer 341b laminated on the base material 341a. The under-fill material 342 is laminated on the pressure-sensitive adhesive layer 341b. The base material 341a and the pressure-sensitive adhesive layer 341b of the dicing tape 341 and the under-fill material 342, which are same as those in the third embodiment, can be used.

[Bonding Step]

In the bonding step, as shown in FIG. 8A, a semiconductor wafer 343, in which circuit surfaces each having a connection member 344 are formed on both surfaces thereof, and the under-fill material 342 of the sealing sheet are bonded together. Since the strength of a semiconductor wafer thinned to a predetermined thickness is low, the semiconductor wafer may be fixed to a support such as support glass with a temporary fixing material interposed therebetween for the purpose of reinforcement in some cases (not shown). In this case, a step of peeling off the support together with the temporary fixing material may be included after bonding the semiconductor wafer and the under-fill material together. Of which circuit surfaces of the semiconductor wafer 343 is bonded to the under-fill material 342 may be changed according to the intended structure of the semiconductor device.

The semiconductor wafer 343 is same as the semiconductor wafer in the third embodiment except that circuit surfaces each having the connection member 344 are formed on both surfaces, and the semiconductor wafer 343 has a predetermined thickness. Connection members 344 on both surfaces of the semiconductor wafer 343 may or may not be electrically connected. For electrical connection of connection members 344, mention is made for connection provided through a via called a TSV type. For bonding conditions, the bonding conditions in the third embodiment can be suitably employed.

[Dicing Step]

Figure 8B:
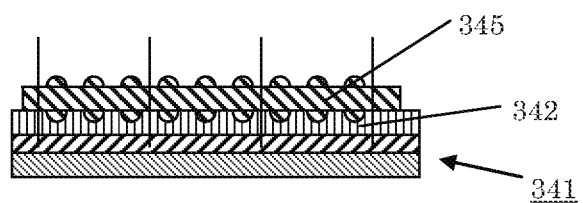
FIG. 8B is a sectional schematic view showing one of the steps for producing a semiconductor device according to another embodiment of the present invention.

In the dicing step, the semiconductor wafer 343 and the under-fill material 342 are diced to form a semiconductor element 345 with the under-fill material (see FIG. 8B). For dicing conditions, the conditions in the third embodiment can be suitably employed. Since dicing is conducted on the exposed circuit surface of the semiconductor wafer 343, a dicing position is easily detected, however, dicing may be performed after oblique light is irradiated to confirm the dicing position as necessary.

[Pickup Step]

Figure 8C:
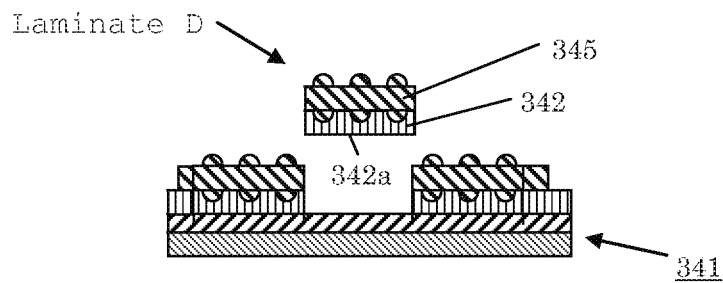
FIG. 8C is a sectional schematic view showing one of the steps for producing a semiconductor device according to another embodiment of the present invention.

In the pickup step, the semiconductor element 345 with the under-fill material 342 is peeled off from the dicing tape 341 (FIG. 8C). For pickup conditions, the pickup conditions in the third embodiment can be suitably employed.

[Position Matching Step]

Figure 8D:
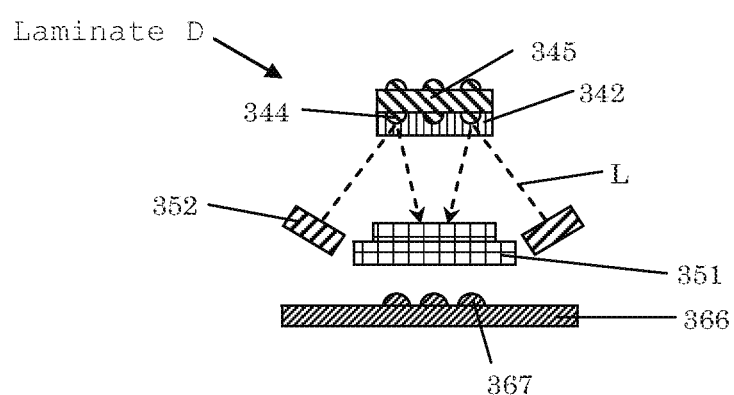
FIG. 8D is a sectional schematic view showing one of the steps for producing a semiconductor device according to another embodiment of the present invention.

Next, in the position matching step, as shown in FIG. 8D, oblique light L is irradiated to the exposed surface 342a of the under-fill material 342 of the semiconductor element 345 with the under-fill material, and a relative position of the semiconductor element 345 and the adherend 366 is matched to a predetermined position for connection of each other. Consequently, the position of the semiconductor element 345 can be detected with high accuracy, and matching of the semiconductor element 345 and the adherend 366 to the predetermined position for connection can be performed easily and efficiently. For conditions in the position matching step, the conditions in the third embodiment can be suitably employed.

[Mounting Process]

Figure 8E:
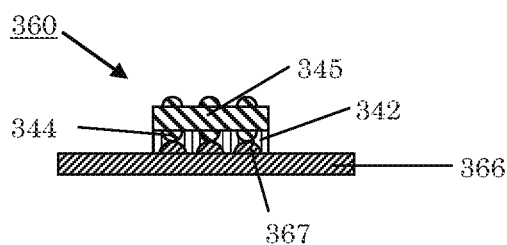
FIG. 8E is a sectional schematic view showing one of the steps for producing a semiconductor device according to another embodiment of the present invention.

In the mounting process, the semiconductor element 345 and the adherend 366 are electrically connected through the connection member 344 while filling a space between the adherend 366 and the semiconductor element 345 using the under-fill material 342 (see FIG. 8E). For conditions in the mounting process, the conditions in the third embodiment can be suitably employed. Consequently, a semiconductor device 360 according to this embodiment can be produced.

Subsequently, as in the third embodiment, an under-fill material curing step and a sealing step may be carried out as necessary.

Fifth Embodiment

In the third embodiment, a back surface grinding tape is used as a constituent member of a sealing sheet, whereas in this embodiment, a pressure-sensitive adhesive layer of the back surface grinding tape is not provided, and a base material alone is used. Thus, a sealing sheet of this embodiment is in such a state that an under-fill material is laminated on a base material. In this embodiment, a grinding step can be optionally carried out, but irradiation of ultraviolet rays before a pickup step is not carried out because a pressure-sensitive adhesive layer is omitted. Except for these aspects, a predetermined semiconductor device can be produced through steps same as those in the third embodiment.

EXAMPLES

Preferred Examples of the present invention will be illustratively described in detail below. However, for the materials, the blending amounts, and so on described in Examples, the scope of the present invention is not intended to be limited thereto unless definitely specified. The part(s) means "part(s) by weight".

Examples According to First Embodiment

Examples 1 to 4 and Comparative Examples 1 and 2

Preparation of Sealing Sheet

The following components were dissolved in methyl ethyl ketone at a ratio shown in Table 1 to prepare an adhesive composition solution having a solid concentration of 23.6 to 60.6% by weight.
Elastomer 1: acrylic acid ester-based polymer having a butyl acrylate-acrylonitrile as a main component (trade name "SG-28GM" manufactured by Nagase chemteX Corporation)
Elastomer 2: acrylic acid ester-based polymer having an ethyl acrylate-methyl methacrylate as a main component (trade name "Paraclone W-197CM" manufactured by Negami Chemical Industrial Co., Ltd.)
Epoxy resin 1: trade name "Epicoat 828" manufactured by JER Corporation
Epoxy resin 2: trade name "Epicoat 1004" manufactured by JER Corporation
Phenol resin: trade name "Mirex XLC-4L" manufactured by Mitsui Chemicals, Incorporated
Filler: spherical silica (trade name "SO-25R" manufactured by Admatechs)
Organic acid: o-anisic acid (trade name "Orthoanisic Acid" manufactured by Tokyo Chemical Industry Co., Ltd.)
Curing agent: Imidazole catalyst (trade name "2PHZ-PW" manufactured by Shikoku Chemicals Corporation)
The adhesive composition solution was applied onto a release-treated film made of a silicone release-treated polyethylene terephthalate film having a thickness of 50 μm as a release liner (separator), and thereafter dried at 130° C. for 2 minutes to thereby prepare an under-fill material having a thickness of 45 μm.

The under-fill material was bonded onto a pressure-sensitive adhesive layer of a back grind tape (trade name "UB-2154" manufactured by Nitto Denko Corporation) using a hand roller to prepare a sealing sheet.
(Measurement of Storage Elastic Modulus E')
First the prepared under-fill material was subjected to a heat-curing treatment at 175° C. for an hour, and then a storage elastic modulus was measured using a solid viscoelasticity measurement apparatus (Model: RSA III manufactured by Rheometric Scientific Co., Ltd.). Specifically, a sample was made to have a size of 40 mm (length)×10 mm (width)×200 μm (thickness), the measurement sample was set in a tool for film tensile measurement, a tensile storage elastic modulus and loss elastic modulus in a temperature zone of from −50 to 300° C. were measured under conditions of frequency: 1 Hz and temperature rising rate: 10° C./min, and a storage elastic modulus (E') at 25° C. was read. The results are shown in Table 1.

(Measurement of Thermal Expansion Coefficient α)
A thermal expansion coefficient α was measured using a thermomechanical measurement apparatus (Model: Q-400EM manufactured by TA Instruments). Specifically, a sample was made to have a size of 15 mm (length)×5 mm (width)×200 μm (thickness), the measurement sample was set in a tool for film tensile measurement in the apparatus, and then placed under conditions of tensile load: 2 g and temperature rising rate: 10° C./min in a temperature zone of from −50 to 300° C., and a thermal expansion coefficient α was calculated from expansion rate at 20° C. to 60° C. The results are shown in Table 1.
(Measurement of Glass Transition Temperature)
The method for measuring a glass transition temperature of an under-fill material is as follows. An under-fill material was first heat-cured by a heating treatment at 175° C. for an hour, and then cutout using a cutter knife into a strip having a thickness of 200 μm, a length of 40 mm (measurement length) and width of 10 mm, and a storage elastic modulus and a loss elastic modulus at −50 to 300° C. were measured using a solid viscoelasticity measurement apparatus (RSA III manufactured by Rheometric Scientific Co., Ltd.). For measurement conditions, the frequency was 1 Hz and the temperature rising rate was 10° C./min. Further, a value of tan δ (G" (loss elastic modulus)/G' (storage elastic modulus)) was calculated to thereby obtain a glass transition temperature. The results are shown in table 1.
(Preparation of Semiconductor Device)
A silicon wafer with a bump on one surface, in which a bump was formed on one surface, was provided, and the prepared sealing sheet was bonded to a surface on which the bump of the silicon wafer with a bump on one surface was formed with the under-fill material as a bonding surface. As the silicon wafer with a bump on one surface, the following article was used. Bonding conditions are as follows. The ratio of the thickness Y (=45 μm) of the under-fill material to the height X (=45 μm) of a connection member (Y/X) was 1.
<Silicon Wafer with a Bump on One Surface>
Diameter of silicon wafer: 8 inches
Thickness of silicon wafer: 0.7 mm (700 μm)
Height of bump: 45 μm
Pitch of bump: 50 μm
Material of bump: solder
<Bonding Conditions>
Bonding device: trade name "DSA 840-WS" manufactured by NITTO SEIKI CO., Ltd.
Bonding speed: 5 mm/min
Bonding pressure: 0.25 MPa
Stage temperature at the time of bonding: 80° C.
Degree of vacuum at the time of bonding: 150 Pa
A silicon wafer with bumps on one surface and a sealing sheet were bonded together in accordance with the procedure described above, followed by grinding the back surface of the silicon wafer under the following conditions.
<Grinding Condition>
Grinding apparatus: trade name "DFG-8560" manufactured by DISCO Corporation
Semiconductor wafer: back surface ground from a thickness of 0.7 mm (700 μm) to 0.2 mm (200 μm)
Next, the semiconductor wafer was diced under the following conditions. Dicing was performed by full cut so as to have a chip size of 7.3 mm×7.3 mm.
<Dicing Conditions>
Dicing device: trade name "DFD-6361" manufactured by DISCO Corporation
Dicing ring: "2-8-1" (manufactured by DISCO Corporation)

Dicing speed: 30 mm/sec
Dicing Blade:
Z1; "203O-SE 27HCDD" manufactured by DISCO Corporation
Z2; "203O-SE 27HCBB" manufactured by DISCO Corporation
Dicing Blade Rotation Number:
Z1; 40000 rpm
Z2; 45000 rpm
Cut mode: step cut
Wafer chip size: 7.3 mm×7.3 mm Next, a laminate of an under-fill material and a semiconductor chip with a bump on one surface was picked up by a method of push-up by a needle from the base material side of each sealing sheet. Pickup conditions are as follows.

Load: 98 N
Retention time: 10 seconds
(Evaluation of Reliability of Semiconductor Device)

10 samples were prepared for each of semiconductor devices of Examples and Comparative Examples, a heat cycle with one cycle of from −55° C. to 125° C. for 30 minutes was repeated 500 cycles, and the semiconductor device was then embedded by an embedding epoxy resin. Then, the semiconductor device was cut in a direction perpendicular to a substrate such that a solder joint was exposed, and the cross section of the exposed solder joint was polished. Thereafter, the polished cross section of the solder joint was observed with an optical microscope (magnification: 1000×), and for each evaluation, "○" was assigned when the solder joint was not broken and "x" was assigned when one or more samples had a broken solder joint. The results are shown in Table 1.

TABLE 1

|  | Example 1 | Example 2 | Example 3 | Example 4 | Example 5 | Comparative Example 1 | Comparative Example 2 |
|---|---|---|---|---|---|---|---|
| Elastomer 1 | 12 | 12 | — | — | 12 | 12 | 5 |
| Elastomer 2 | — | — | 40 | 30 | — | — | — |
| Epoxy resin 1 | 33 | 33 | 7.5 | 8.8 | 33 | 33 | 33 |
| Epoxy resin 2 | 11 | 11 | 22.5 | 26.2 | 11 | 11 | 11 |
| Phenol resin | 44 | 44 | 30 | 35 | 44 | 44 | 44 |
| Filler A | 185 | 100 | 150 | 150 | 70 | 40 | 0 |
| Filler B | 0 | 0 | 0 | 0 | 0 | 0 | 0 |
| Organic acid | 0.5 | 0.5 | 0.5 | 0.5 | 0.5 | 0.5 | 0.5 |
| Curing agent | 0.5 | 0.5 | 0.5 | 0.5 | 0.5 | 0.5 | 0.5 |
| Thermal expansion coefficient α [ppm/K] | 18 | 30 | 125 | 98 | 51 | 71 | 90 |
| Storage elastic modulus E' [MPa] | 9000 | 5500 | 350 | 500 | 4300 | 3700 | 2800 |
| Tg [° C.] | 137 | 135 | 153 | 154 | 140 | 140 | 138 |
| α × E' [Pa/K] | 162000 | 165000 | 43750 | 49000 | 219300 | 262700 | 252000 |
| Reliability test Number of good samples | 10/10 | 10/10 | 10/10 | 10/10 | 10/10 | 8/10 | 6/10 |
| Assessment | ○ | ○ | ○ | ○ | ○ | x | x |

* In the table, the unit of the value for each component is part(s) by weight.

<Pickup Conditions>
Pickup device: trade name "SPA-300" manufactured by SHINKAWA LTD.
The number of needles: 9
Needle push-up amount: 500 μm (0.5 mm)
Needle push-up speed: 20 mm/second
Pickup time: 1 second
Expanding amount: 3 mm Finally, the semiconductor chip was mounted by heat pressure-bonding the semiconductor chip to a BGA substrate under the following heat pressure-bonding conditions in the state that the bump forming surface of the semiconductor chip and the BGA substrate are made to face to each other. Consequently, a semiconductor device with a semiconductor chip mounted on a BGA substrate was obtained. In this step, a two-stage process of performing heat pressure-bonding under the heat pressure-bonding condition 1 and then under the heat pressure-bonding condition 2 was carried out.
<Heat Pressure-Bonding Condition 1>
Pickup device: trade name "FCB-3" manufactured by Panasonic Corporation
Heating temperature: 150° C.
Load: 98 N
Retention time: 10 seconds
<Heat Pressure-Bonding Condition 2>
Pickup device: trade name "FCB-3" manufactured by Panasonic Corporation
Heating temperature: 260° C.

As apparent from Table 1, in the semiconductor devices of Examples, occurrence of breaking of the solder joint was inhibited. On the other hand, in the semiconductor devices of Comparative Examples 1 and 2, the solder joint was broken. Thus, it is apparent that by using an under-fill material, of which storage elastic modulus E' and thermal expansion coefficient α after heat curing satisfy a predetermined relationship, a highly-reliable semiconductor device whose solder joint is inhibited from being broken can be produced.

Examples According to Second Embodiment

Example 1

4.74 parts of a naphthalene-type epoxy resin (product name: HP 4032D manufactured by DIC Corporation) having an epoxy equivalent of 142 g/eq, 1.19 parts of a phenol novolak-type epoxy resin (product name: EPPN 501HY manufactured by Nippon Kayaku Co., Ltd.) having an epoxy equivalent of 169 g/eq, 7.05 parts of a phenol novolak resin (product name: MEH-78005 manufactured by MEIWA PLASTIC INDUSTRIES, LTD.) having a phenol equivalent of 175 g/eq, 1.8 parts of a butyl acrylate-ethyl acrylate-acrylonitrile copolymer (product name: Teisan resin SG-28GM manufactured by Nagase chemteX Corporation) having a weight average molecular weight of 900000, p-anisic acid (pKa=4.5), and 0.18 parts of triphenylphosphine as a curing accelerator (manufactured by Shikoku Chemicals Corporation) were dissolved in methyl ethyl ketone, and 10.47 parts of an inorganic filler (product name: SE2050MC manufactured by Admatechs; average particle diameter: 0.5 μm) were added thereto to prepare a resin composition solution having a solid concentration of 40% by weight.

The resin composition solution was applied onto a release-treated film (separator) made of a silicone release-treated polyethylene terephthalate film having a thickness of 50 μm, and then dried at 130° C. for 2 minutes to thereby prepare a sheet-like sealing composition having a thickness of 55 μm.

Example 2

A sheet-like sealing composition was prepared in the same manner as in Example 1 except that p-dimethylamino benzoic acid (pKa=4.9) was used in place of p-anisic acid.

Example 3

A sheet-like sealing composition was prepared in the same manner as in Example 1 except that octanedioic acid (pKa$_1$=4.5) was used in place of p-anisic acid.

Example 4

A sheet-like sealing composition was prepared in the same manner as in Example 1 except that dodecanedioic acid (pKa$_1$=5.0) was used in place of p-anisic acid.

Example 5

A sheet-like sealing composition was prepared in the same manner as in Example 1 except that oleic acid (pKa=5.0) was used in place of p-anisic acid.

Example 6

A sheet-like sealing composition was prepared in the same manner as in Example 1 except that 1,2-cyclohexanedicarboxylic acid (pKa$_1$=4.4) was used in place of p-anisic acid.

Example 7

A sheet-like sealing composition was prepared in the same manner as in Example 1 except that 2-phenoxybenzoic acid (pKa=3.5) was used in place of p-anisic acid.

Example 8

A sheet-like sealing composition was prepared in the same manner as in Example 1 except that 2-phenylbenzoic acid (pKa=3.5) was used in place of p-anisic acid.

Comparative Example 1

A sheet-like sealing composition was prepared in the same manner as in Example 1 except that 2,6-dihydroxybenzoic acid (pKa=1.2) was used in place of p-anisic acid.

Comparative Example 2

A sheet-like sealing composition was prepared in the same manner as in Example 1 except that 2-nitrobenzoic acid (pKa=2.5) was used in place of p-anisic acid.

Comparative Example 3

A sheet-like sealing composition was prepared in the same manner as in Example 1 except that phenol (pKa=9.9) was used in place of p-anisic acid.

Comparative Example 4

A sheet-like sealing composition was prepared in the same manner as in Example 1 except that p-anisic acid was not added.

Comparative Example 5

A sheet-like sealing composition was prepared in the same manner as in Example 1 except that a butyl acrylate-ethyl acrylate-acrylonitrile copolymer was not added.

(Evaluation of Bump Joining Property)

A semiconductor chip with bumps on one surface, in which bumps were formed on one surface, was provided, and the sheet-like sealing composition prepared in each of Examples and Comparative Examples was bonded to a surface of the semiconductor chip with bumps on one surface, on which bumps were formed. As the semiconductor chip with bumps on one surface, one described below was used. Bonding conditions were as described below. The ratio of the thickness Y (=65 μm) of the sheet-like sealing composition to the height X (=65 μm) of the bump (Y/X) was 1.0.

(Evaluation of Flexibility of Sheet-Like Sealing Composition)

The sheet-like sealing composition obtained as described above was left standing under conditions of temperature: 25° C. and humidity: 70% for a week, and then bent at 90°, and for each evaluation, "○" was assigned when cracks were not generated, and "x" was assigned when cracks were generated.

<Semiconductor Chip with Bumps on One Surface>

Size: 10 mm×10 mm

Thickness: 0.5 mm (500 μm)

Height of bump: 65 μm

Number of bumps: 1960

Material of bump: Sn—Ag—Cu solder

<Bonding Conditions>

Bonding device: trade name "DSA 840-WS" manufactured by NITTO SEIKI CO., Ltd.

Bonding speed: 10 mm/min

Bonding pressure: 0.5 MPa

Stage temperature at the time of bonding: 75° C.

Degree of vacuum at the time of bonding: 1000 Pa

Next, the connection step was carried out under the heat pressure-bonding condition 1 and then under the heat pressure-bonding condition 2 as described below, so that the semiconductor chip was heat pressure-bonded to a copper plate having a thickness of 200 μm to join the former and the latter together, with the bump forming surface of the semiconductor chip and the copper plate being made to face to each other.

<Heat Pressure-Bonding Condition 1>

Flip-chip bonder: trade name "FCB-3" manufactured by Panasonic Corporation

Heating temperature: 185° C.

Load: 6 kg (58.8N)

Retention time: 20 seconds

<Heat Pressure-Bonding Condition 2>

Flip-chip bonder: trade name "FCB-3" manufactured by Panasonic Corporation

Heating temperature: 300° C.

Load: 1 kg (9.8 N)

Retention time: 10 seconds

Evaluations of the bump joining property were made in the following procedure. A semiconductor chip with bumps was peeled off from a copper plate, and a region on the copper plate, to which the bumps had been joined, was observed to determine how much solder as a bump forming material was transferred to and remained on the joint region on the copper plate using an image recognition device (trade name "C9597-11" manufactured by Hamamatsu Photonics K.K.). For each evaluation, "○" was assigned when solder remained on almost the entire joint region (when taking a plan view of the copper plate, solder remained in 80% or more of an area within a maximum outer edge (circle) of the joint region in a joined state) and "x" was assigned when the ratio of such an area where solder remained was less than 80%. The results are shown in Table 2.

TABLE 2

| | pKa | Example 1 | Example 2 | Example 3 | Example 4 | Example 5 | Example 6 | Example 7 | Example 8 |
|---|---|---|---|---|---|---|---|---|---|
| Naphthalene-type epoxy resin (epoxy group equivalent: 142 g/eq) | | 4.74 | 4.74 | 4.74 | 4.74 | 4.74 | 4.74 | 4.74 | 4.74 |
| Phenol novolak-type epoxy resin (epoxy group equivalent: 169 g/eq) | | 1.19 | 1.19 | 1.19 | 1.19 | 1.19 | 1.19 | 1.19 | 1.19 |
| Phenol novolak resin (phenol group equivalent: 175 g/eq) | | 7.05 | 7.05 | 7.05 | 7.05 | 7.05 | 7.05 | 7.05 | 7.05 |
| Butyl acrylate-ethyl acrylate-acrylonitrile copolymer (Tg = −10° C., weight average molecular weight 900000) | | 1.8 | 1.8 | 1.8 | 1.8 | 1.8 | 1.8 | 1.8 | 1.8 |
| Flux agent  p-anisic acid | 4.5 | 0.75 | | | | | | | |
| p-dimethylaminobenzoic acid | 4.9 | | 0.75 | | | | | | |
| Octanedioic acid | 4.5 | | | 0.75 | | | | | |
| Dodecanedioic acid | 5.0 | | | | 0.75 | | | | |
| Oleic acid | 5.0 | | | | | 0.75 | | | |
| 1,2-cyclohexanedicarboxylic acid | 4.4 | | | | | | 0.75 | | |
| 2-phenoxybenzoic acid | 3.5 | | | | | | | 0.75 | |
| 2-phenylbenzoic acid | 3.5 | | | | | | | | 0.75 |
| 2,6-dihydroxybenzoic acid | 1.2 | | | | | | | | |
| 2-nitrobenzoic acid | 2.5 | | | | | | | | |
| Phenol | 9.9 | | | | | | | | |
| Silica filler having an average particle size of 0.5 μm | | 10.47 | 10.47 | 10.47 | 10.47 | 10.47 | 10.47 | 10.47 | 10.47 |
| Evaluation of bump joining property | | ○ | ○ | ○ | ○ | ○ | ○ | ○ | ○ |
| Evaluation of flexibility | | ○ | ○ | ○ | ○ | ○ | ○ | ○ | ○ |

| | Comparative Example 1 | Comparative Example 2 | Comparative Example 3 | Comparative Example 4 | Comparative Example 5 |
|---|---|---|---|---|---|
| Naphthalene-type epoxy resin (epoxy group equivalent: 142 g/eq) | 4.74 | 4.74 | 4.74 | 4.74 | 4.74 |
| Phenol novolak-type epoxy resin (epoxy group equivalent: 169 g/eq) | 1.19 | 1.19 | 1.19 | 1.19 | 1.19 |
| Phenol novolak resin (phenol group equivalent: 175 g/eq) | 7.05 | 7.05 | 7.05 | 7.05 | 7.05 |
| Butyl acrylate-ethyl acrylate-acrylonitrile copolymer (Tg = −10° C., weight average molecular weight 900000) | 1.8 | 1.8 | 1.8 | 1.8 | 0 |
| Flux agent  p-anisic acid | | | | | 0.75 |
| p-dimethylaminobenzoic acid | | | | | |
| Octanedioic acid | | | | | |
| Dodecanedioic acid | | | | | |
| Oleic acid | | | | | |
| 1,2-cyclohexanedicarboxylic acid | | | | | |
| 2-phenoxybenzoic acid | | | | | |
| 2-phenylbenzoic acid | | | | | |
| 2,6-dihydroxybenzoic acid | 0.75 | | | | |
| 2-nitrobenzoic acid | | 0.75 | | | |
| Phenol | | | 0.75 | | |
| Silica filler having an average particle size of 0.5 μm | 10.47 | 10.47 | 10.47 | 10.47 | 10.47 |
| Evaluation of bump joining property | x | x | x | x | ○ |
| Evaluation of flexibility | x | x | ○ | ○ | x |

* The unit of the value for each component is part(s) by weight except for pKa.

As apparent from Table 2, in the sheet-like resin compositions of Examples, solder remained on almost the entire joint region, and a good bump joining property was confirmed. On the other hand, in Comparative Examples 1 to 4, little solder remained on the joint region, or solder only partially remained if any, and the bump joining property was insufficient and the bonding reliability was low. In Comparative Example 5, the bump joining property was good, but no stable flexibility was shown.

Examples According to Third Embodiment

Preparation of Sealing Sheet

The following components were dissolved in methyl ethyl ketone at a ratio shown in Table 3 to prepare an adhesive composition solution having a solid concentration of 23.6 to 60.6% by weight.
Elastomer 1: acrylic acid ester-based polymer having an ethyl acrylate-methyl methacrylate as a main component (trade name "Paraclone W-197CM" manufactured by Negami Chemical Industrial Co., Ltd.)
Elastomer 2: acrylic acid ester-based polymer having a butyl acrylate-acrylonitrile as a main component (trade name "SG-P3" manufactured by Nagase chemteX Corporation)
Epoxy resin 1: trade name "Epicoat 828" manufactured by JER Corporation
Epoxy resin 2: trade name "Epicoat 1004" manufactured by JER Corporation
Phenol resin: trade name "Mirex XLC-4L" manufactured by Mitsui Chemicals, Incorporated
Filler: spherical silica (trade name "SO-25R" manufactured by Admatechs)
Organic acid: o-anisic acid (trade name "Orthoanisic Acid" manufactured by Tokyo Chemical Industry Co., Ltd.)
Curing agent: Imidazole catalyst (trade name "2PHZ-PW" manufactured by Shikoku Chemicals Corporation)
The prepared adhesive composition solution was applied onto a release-treated film made of a silicone release-treated polyethylene terephthalate film having a thickness of 50 μm as a release liner (separator), and dried at 130° C. for 2 minutes to thereby prepare under-fill materials A to C having a thickness of 45 μm.
The under-fill material was bonded onto a pressure-sensitive adhesive layer of a back grind tape (trade name "UB-2154" manufactured by Nitto Denko Corporation) using a hand roller to prepare sealing sheets A to C.
(Measurement of Total Light Transmittance of Under-Fill Material)
The total light transmittance of under-fill materials A to C was measured using Haze Meter HM-150 (manufactured by MURAKAMI COLOR RESEARCH LABORATORY). Measurement was performed in accordance with JIS K 7361. The results are shown in Table 3.

Example 1

Preparation of Semiconductor Device

A silicon wafer with bumps on one surface, in which bumps were formed on one surface, was provided, and the prepared sealing sheet was heat pressure-bonded to a surface on which the bumps of the silicon wafer with bumps on one surface were formed with the under-fill material as a bonding surface. As the silicon wafer with bumps on one surface, the following article was used. Heat pressure-bonding conditions were as follows. The ratio of the thickness Y (=45 μm) of the under-fill material to the height X (=45 μm) of a connection member (Y/X) was 1. In four corners of a region (7.3 mm×7.3 mm) to be cut out as a semiconductor element, alignment marks were given at a distance of 0.15 mm from each side.
<Silicon Wafer with Bumps on One Surface>
Diameter of silicon wafer: 8 inches
Thickness of silicon wafer: 0.7 mm (700 μm)
Height of bump: 45
Pitch of bump: 50 μm
Material of bump: SnAg solder+copper pillar
<Heat Pressure-Bonding Conditions>
Bonding device: trade name "DSA 840-WS" manufactured by NITTO SEIKI CO., Ltd.
Bonding speed: 5 mm/min
Bonding pressure: 0.5 MPa
Stage temperature at the time of bonding: 80° C.
Degree of vacuum at the time of bonding: 150 Pa
A silicon wafer with bumps on one surface and a sealing sheet A were bonded together in accordance with the procedure described above, followed by grinding the back surface of the silicon wafer under the following conditions.
<Grinding Conditions>
Grinding apparatus: trade name "DFG-8560" manufactured by DISCO Corporation
Semiconductor wafer: back surface ground from a thickness of 0.7 mm (700 μm) to 0.2 mm (200 μm)
After the back surface was ground, a silicon wafer was peeled off with an under-fill material from a back grind tape together, and the silicon wafer was bonded onto a pressure-sensitive adhesive layer of a dicing tape (DU-300 manufactured by Nitto Denko Corporation) and thereby fixed. At this time, the back surface of the silicone wafer and the pressure-sensitive adhesive layer were bonded together, and the under-fill material bonded to the circuit surface of the silicon wafer was exposed.
Oblique light was irradiated at an incidence angle of 45° to the exposed surface of the under-fill material to determine a dicing position.
Next, dicing of the silicon wafer was performed under the following conditions. Dicing was performed by full cut so as to have a chip size of 7.3 mm×7.3 mm.
<Dicing Conditions>
Dicing device: trade name "DFD-6361" manufactured by DISCO Corporation
Dicing ring: "2-8-1" (manufactured by DISCO Corporation)
Dicing speed: 30 mm/sec
Dicing Blade:
Z1; "203O-SE 27HCDD" manufactured by DISCO Corporation
Z2; "203O-SE 27HCBB" manufactured by DISCO Corporation
Dicing Blade Rotation Number:
Z1; 40000 rpm
Z2; 40000 rpm
Cut mode: step cut
Wafer chip size: 7.3 mm×7.3 mm
Next, a laminate of the under-fill material A and the semiconductor chip with bumps on one surface was picked up by a method of push-up with a needle from the base material side of the dicing tape. The pickup conditions were as follows.
<Pickup Conditions>
Pickup device: trade name "SPA-300" manufactured by SHINKAWA LTD.

The number of needles: 9

Needle push-up amount: 500 μm (0.5 mm)

Needle push-up speed: 20 mm/second

Pickup time: 1 second

Expanding amount: 3 mm

Oblique light was irradiated to the exposed surface of the under-fill material A at an incidence angle α of 45° to perform position matching, and finally the semiconductor chip was mounted on a BGA substrate with the bump forming surface of the semiconductor chip and the BGA substrate being made to face to each other at a predetermined position for connection under the following mounting conditions. Consequently, a semiconductor device having a semiconductor chip mounted on a BGA substrate was obtained. In this step, a two-stage process of mounting a semiconductor chip under the mounting condition 1 and then under the mounting condition 2 was carried out.

<Mounting Condition 1>

Pickup device: trade name "FCB-3" manufactured by Panasonic Corporation

Heating temperature: 150° C.

Load: 98 N

Retention time: 10 seconds

<Mounting Condition 2>

Pickup device: trade name "FCB-3" manufactured by Panasonic Corporation

Heating temperature: 260° C.

Load: 98 N

Retention time: 10 seconds

Example 2

A semiconductor device was prepared in the same manner as in Example 1 except that the incidence angle of oblique light at the time of position matching was 15°.

Example 3

A semiconductor device was prepared in the same manner as in Example 1 except that the incidence angle of oblique light at the time of position matching was 80°.

Example 4

A semiconductor device was prepared in the same manner as in Example 1 except that the sealing sheet B including the under-fill material B was used in place of the sealing sheet A.

Example 5

A semiconductor device was prepared in the same manner as in Example 1 except that a back grind tape was not bonded to the under-fill material A, and a laminate of a release film and the under-fill material A was used as a sealing sheet.

Comparative Example 1

A semiconductor device was prepared in the same manner as in Example 1 except that oblique light was not irradiated.

Comparative Example 2

A semiconductor device was prepared in the same manner as in Example 1 except that the sealing sheet C including the under-fill material C was used in place of the sealing sheet A.

(Evaluation of Solder Joint)

10 samples were prepared for each of semiconductor devices of Examples and Comparative Examples, and each semiconductor device was embedded by an embedding epoxy resin. Then, the semiconductor device was cut in a direction perpendicular to a substrate such that a solder joint was exposed, and the cross section of the exposed solder joint was polished. Thereafter, the polished cross section of the solder joint was observed with an optical microscope (magnification: 1000×), and for each evaluation, "○" was assigned when the solder joint was joined, and "x" when one or more samples had a displaced solder joint, so that the solder joint was not joined with a pad on the substrate side.

TABLE 3

|  | Example 1 | Example 2 | Example 3 | Example 4 | Example 5 | Comparative Example 1 | Comparative Example 2 |
| --- | --- | --- | --- | --- | --- | --- | --- |
| Under-fill material | A | A | A | B | Only A | A | C |
| Elastomer 1 | 20 | 20 | 20 | — | 20 | 20 | — |
| Elastomer 2 | — | — | — | 10 | — | — | 40 |
| Epoxy resin 1 | 30 | 30 | 30 | 10 | 30 | 30 | 15 |
| Epoxy resin 2 | 10 | 10 | 10 | 30 | 10 | 10 | 15 |
| Phenol resin | 40 | 40 | 40 | 40 | 40 | 40 | 30 |
| Filler | 60 | 60 | 60 | 40 | 60 | 60 | 120 |
| Organic acid | 5 | 5 | 5 | 5 | 5 | 5 | 5 |
| Curing agent | 0.5 | 0.5 | 0.5 | 0.5 | 0.5 | 0.5 | 0.5 |
| Total light transmittance [%] | 70 | 70 | 70 | 50 | 70 | 70 | 45 |
| Incidence angle of oblique light α [°] | 45 | 15 | 80 | 45 | 45 | OFF | 45 |
| Results of evaluation of joining | ○ | ○ | ○ | ○ | ○ | x |  |

* In the table, the unit of the value for each component is part(s) by weight.
* In Example 5, a sealing sheet having only the under-fill material A laminated on a base material is used.

As apparent from Table 3, in the semiconductor devices of Examples, no displacement occurred in the solder joint. On the other hand, the semiconductor devices of Comparative Examples, a displacement occurred in the solder joint. It can be considered that an alignment mark provided on the semiconductor element could not be recognized with good accuracy because oblique light was not irradiated in Comparative Example 1 and because the total light transmittance of the under-fill material was too low in Comparative Example 2, and therefore a positional displacement occurred at the time of joining the semiconductor element to the adherend.

What is claimed is:

1. An under-fill material, comprising a carboxylic acid-based flux agent, wherein:

the carboxylic acid-based flux agent comprises at least one selected from the group consisting of:
- an aromatic carboxylic acid having in each molecule at least one substituent selected from the group consisting of an alkyl group, an alkoxy group, an aryloxy group, an aryl group, and an alkylamino group; and
- an aliphatic carboxylic acid having in each molecule one or more carboxyl group and having a carbon number of 8 or more; and a storage elastic modulus E' [MPa] and a thermal expansion coefficient α [ppm/K] after carrying out a heat-curing treatment at 175° C. for an hour satisfy the following formula (1) at 25° C.:

$$E' \times \alpha < 250000 \text{ [Pa/K]} \quad (1).$$

2. The under-fill material according to claim 1, wherein the storage elastic modulus E' is 100 to 10000 [MPa] and the thermal expansion coefficient α is 10 to 200 [ppm/K].

3. The under-fill material according to claim 1, wherein the storage elastic modulus E' [MPa] and the thermal expansion coefficient α [ppm/K] satisfy the following formula (2):

$$10000 < E' \times \alpha < 250000 \text{ [Pa/K]} \quad (2).$$

4. The under-fill material according to claim 1, wherein the under-fill material contains a thermoplastic resin and a thermosetting resin.

5. The under-fill material according to claim 4, wherein the thermoplastic resin contains an acrylic resin.

6. The under-fill material according to claim 4, wherein the thermosetting resin contains an epoxy resin and a phenol resin.

7. A sealing sheet comprising:
- a back surface grinding tape; and
- the under-fill material according to claim 1,
- wherein the under-fill material is laminated on the back surface grinding tape.

8. A method for producing a semiconductor device comprising an adherend, a semiconductor element electrically connected to the adherend, and an under-fill material that fills a space between the adherend and the semiconductor element, wherein the method comprises:
- a bonding step of bonding together a circuit surface of a semiconductor wafer, on which a connection member is formed, and the under-fill material of the sealing sheet according to claim 7;
- a grinding step of grinding a surface opposite to the circuit surface of the semiconductor wafer;
- a dicing step of dicing the semiconductor wafer to form a semiconductor element with the under-fill material; and
- a connection step of electrically connecting the semiconductor element and the adherend through the connection member while filling the space between the adherend and the semiconductor element using the under-fill material.

* * * * *